(12) United States Patent
Krishnan et al.

(10) Patent No.: US 8,310,807 B2
(45) Date of Patent: Nov. 13, 2012

(54) CAPACITORS HAVING DIELECTRIC REGIONS THAT INCLUDE MULTIPLE METAL OXIDE-COMPRISING MATERIALS

(75) Inventors: Rishikesh Krishnan, Poughkeepsie, NY (US); John Smythe, Boise, ID (US); Vishwanath Bhat, Boise, ID (US); Noel Rocklein, Boise, ID (US); Bhaskar Srinivasan, Boise, ID (US); Jeff Hull, Boise, ID (US); Chris Carlson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 432 days.

(21) Appl. No.: 12/483,474

(22) Filed: Jun. 12, 2009

(65) Prior Publication Data

US 2010/0315760 A1    Dec. 16, 2010

(51) Int. Cl.
*H01G 4/06* (2006.01)
*H01G 4/20* (2006.01)
*H01G 4/10* (2006.01)

(52) U.S. Cl. .................... 361/313; 361/311; 361/322

(58) Field of Classification Search .......... 361/311, 361/312, 313, 322
See application file for complete search history.

(56) References Cited

U.S. PATENT DOCUMENTS

| | | | |
|---|---|---|---|
| 3,568,010 A * | 3/1971 | Maserjian | 361/322 |
| 5,742,471 A | 4/1998 | Barbee, Jr. et al. | |
| 6,943,392 B2 | 9/2005 | Agarwal et al. | |
| 6,958,302 B2 | 10/2005 | Ahn et al. | |
| 7,067,921 B2 | 6/2006 | Choi | |
| 7,268,411 B2 | 9/2007 | Shimizu et al. | |
| 7,592,217 B2 * | 9/2009 | Lee | 438/240 |
| 7,595,240 B2 * | 9/2009 | Lee et al. | 438/264 |
| 7,759,718 B2 * | 7/2010 | Kang et al. | 257/310 |
| 7,835,134 B2 * | 11/2010 | Kil et al. | 361/313 |
| 2006/0097305 A1 | 5/2006 | Lee | |
| 2006/0151823 A1 * | 7/2006 | Govindarajan | 257/310 |
| 2007/0249125 A1 | 10/2007 | Lee et al. | |
| 2008/0014694 A1 | 1/2008 | Bhat et al. | |
| 2008/0057659 A1 | 3/2008 | Forbes et al. | |
| 2008/0087890 A1 | 4/2008 | Ahn et al. | |
| 2008/0087930 A1 | 4/2008 | Lee et al. | |
| 2008/0268591 A1 | 10/2008 | Miller et al. | |

OTHER PUBLICATIONS

U.S. Appl. No. 12/483,455, filed Jun. 12, 2009, Krishnan et al.

* cited by examiner

*Primary Examiner* — David M Sinclair
(74) *Attorney, Agent, or Firm* — Wells St. John, P.S.

(57) ABSTRACT

Capacitors and methods of forming capacitors are disclosed, and which include an inner conductive metal capacitor electrode and an outer conductive metal capacitor electrode. A capacitor dielectric region is received between the inner and the outer conductive metal capacitor electrodes and has a thickness no greater than 150 Angstroms. Various combinations of materials of thicknesses and relationships relative one another are disclosed which enables and results in the dielectric region having a dielectric constant k of at least 35 yet leakage current no greater than $1\times10^{-7}$ amps/cm² at from $-1.1$V to $+1.1$V.

32 Claims, 12 Drawing Sheets

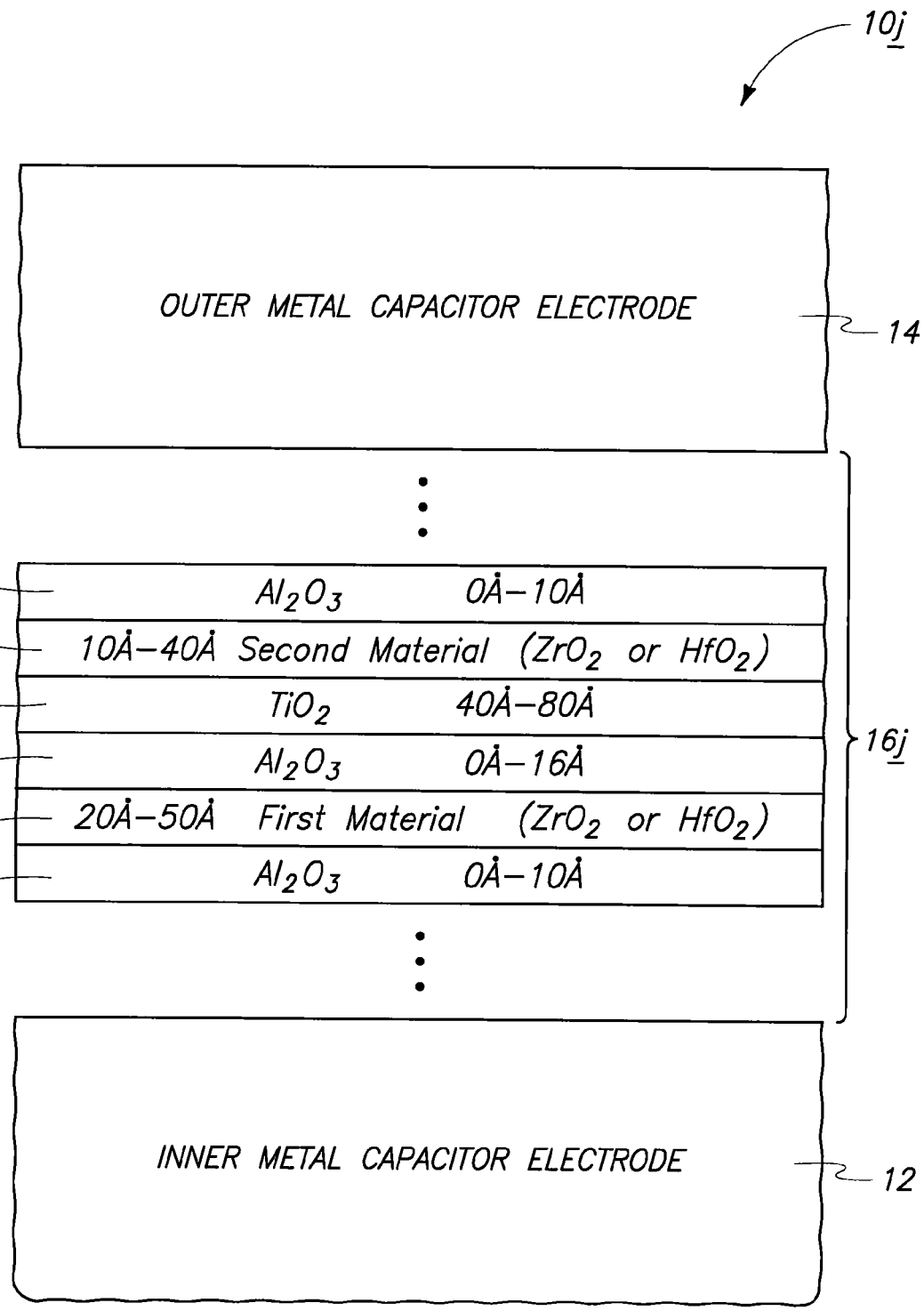

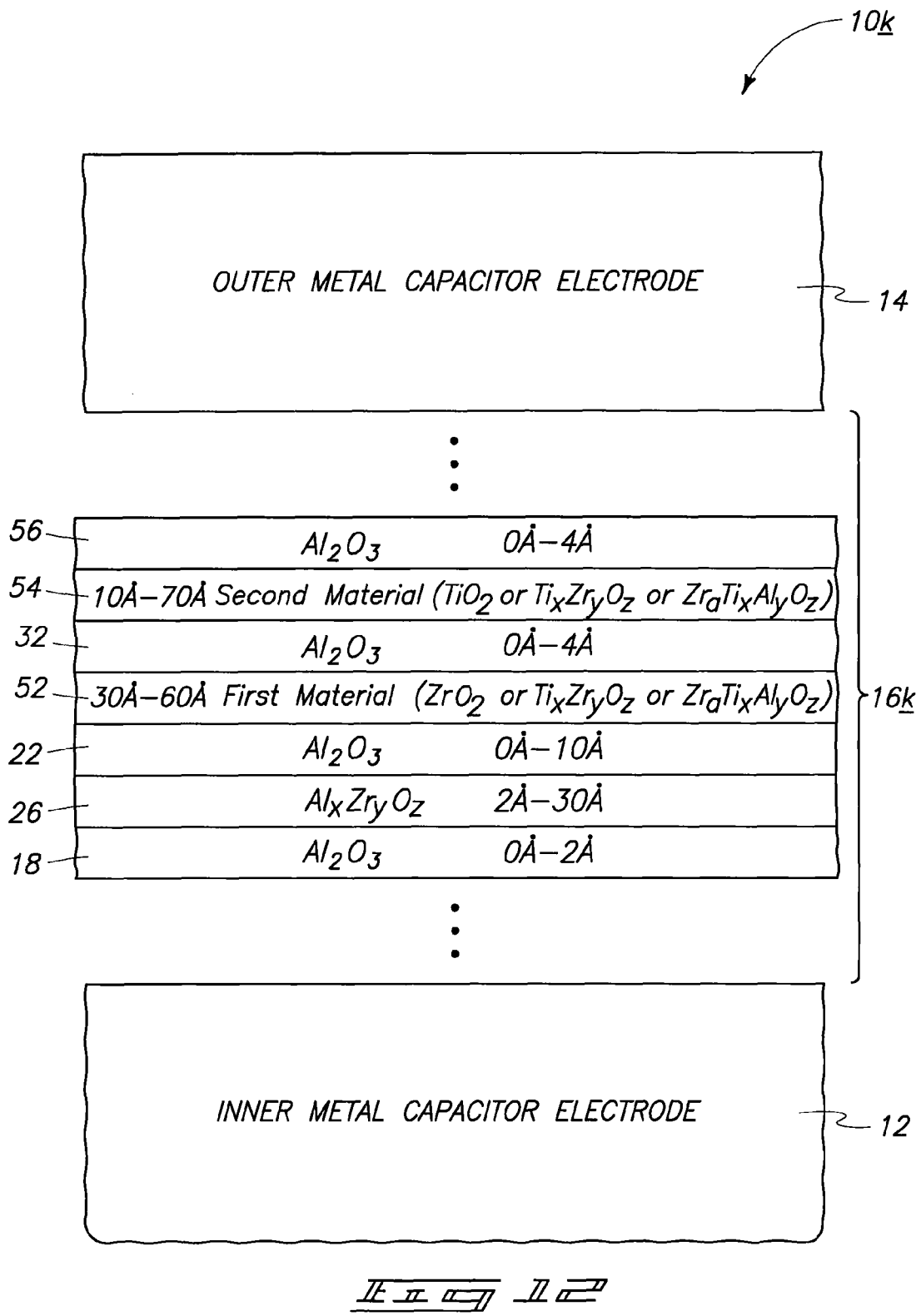

US 8,310,807 B2

CAPACITORS HAVING DIELECTRIC REGIONS THAT INCLUDE MULTIPLE METAL OXIDE-COMPRISING MATERIALS

TECHNICAL FIELD

Embodiments disclosed herein pertain to capacitors having dielectric regions that include multiple metal oxide-comprising materials, and to methods of forming such capacitors.

BACKGROUND

Capacitors are commonly-used electrical components in semiconductor integrated circuitry, for example memory circuitry such as DRAM circuitry. A typical capacitor is comprised of two conductive electrodes separated by a non-conducting capacitor dielectric region. As integrated circuit density increases, there is a continuing challenge to maintain sufficiently high storage capacitance despite decreasing capacitor area. One way of increasing cell capacitance is through cell structure techniques. Such techniques include three-dimensional cell capacitors, such as trenched and stack capacitors. Other ways of increasing cell capacitance include the development and utilization of new materials for one or both of the electrodes and the capacitor dielectric region.

One type of capacitor utilizes a metal-insulator-metal (MIM) construction. Such can provide capacitance increase in comparison to where at least one of the capacitor electrodes is conductively doped semiconductor material. However, such capacitance increase also undesirably significantly increases leakage current across the capacitor. Further, deposition of oxide-containing capacitor dielectric materials to form a part of a capacitor dielectric region can be problematic in the fabrication of metal-containing capacitor electrodes.

Accordingly, needs remain for improved capacitor constructions and methods of forming capacitors.

BRIEF DESCRIPTION OF THE DRAWINGS

FIG. 1 is a diagrammatic cross sectional view of a capacitor construction in accordance with an embodiment of the invention.

FIG. 11 is a diagrammatic cross sectional view of a capacitor construction in accordance with an embodiment of the invention.

FIG. 12 is a diagrammatic cross sectional view of a capacitor construction in accordance with an embodiment of the invention.

DETAILED DESCRIPTION OF EXAMPLE EMBODIMENTS

Figure 2:
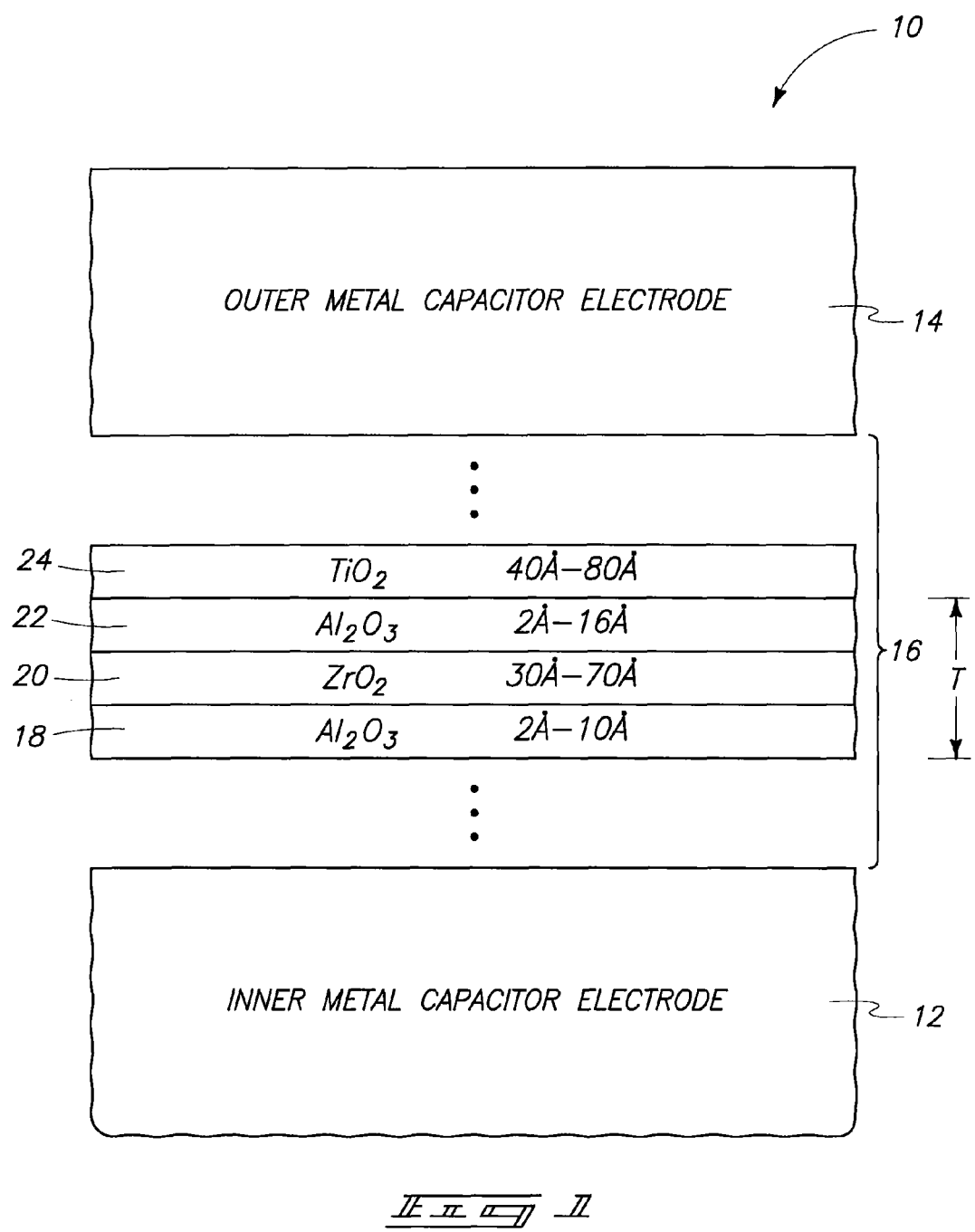
FIG. 2 is a diagrammatic cross sectional view of a capacitor construction in accordance with an embodiment of the invention.
Figure 2:
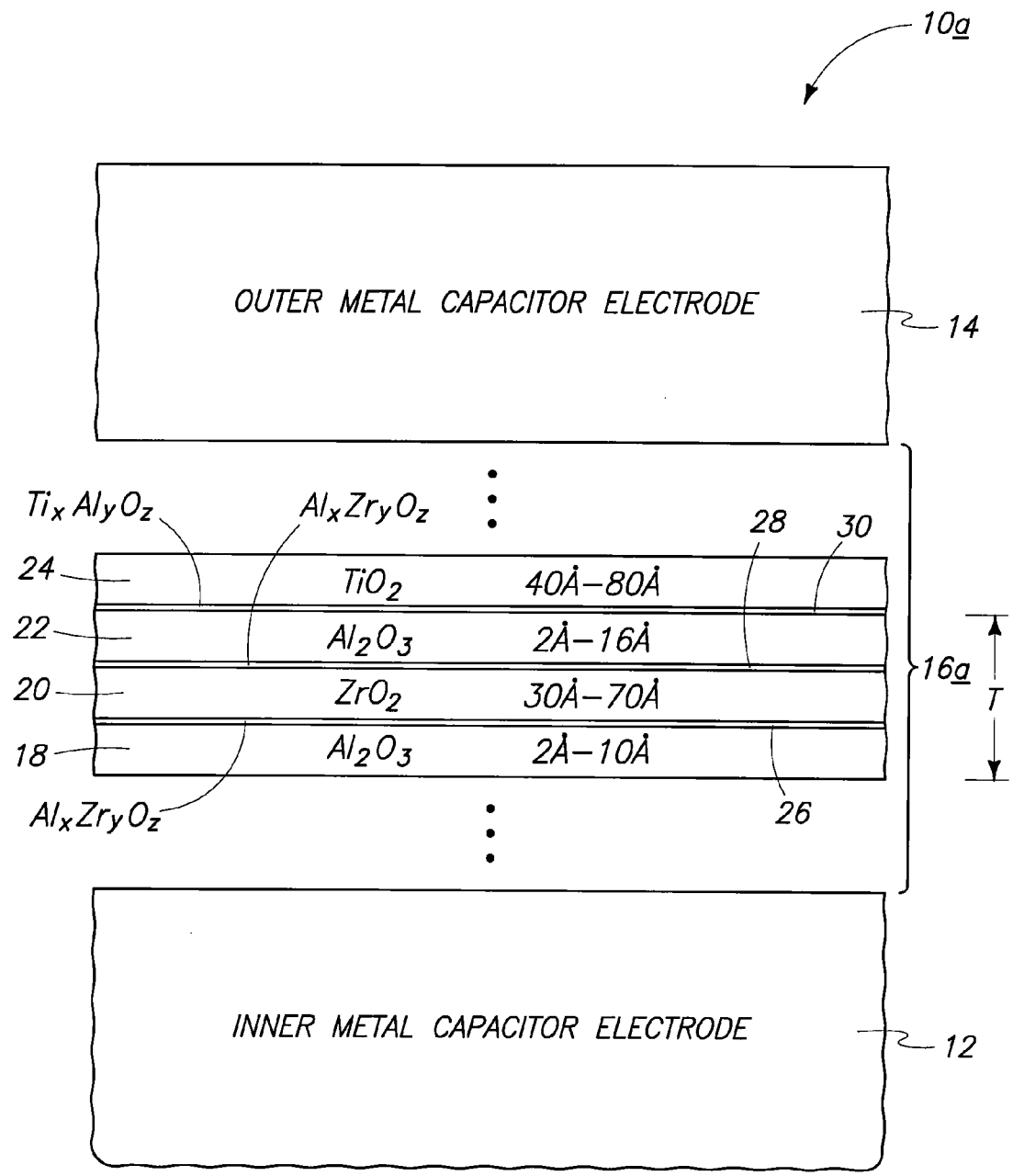

A first embodiment capacitor 10 in accordance with the invention is described with reference to FIG. 1. Such is diagrammatically shown, and would be received over or as part of a substrate, for example a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Capacitor 10 includes an inner conductive metal capacitor electrode 12, an outer conductive metal capacitor electrode 14, and a capacitor dielectric region 16 received there-between. In the context of this document, "metal" requires the capacitor electrode to comprise, consist essentially of, or consist of one or more conductive elemental metals, one or more conductive metal alloys, and/or one or more conductive metal compounds. Specific examples include one or more of TiN, Pt, and Ru. Further in the context of this document, "inner" and "outer" are relative to thickness of the substrate over or upon which the capacitor (or the capacitor in fabrication) is received in a direction orthogonal/vertical to a major/horizontal surface of such substrate. Accordingly, the inner conductive metal capacitor electrode is received elevationally deeper within the substrate thickness than is the outer conductive metal capacitor electrode. Accordingly, inner conductive metal capacitor electrode 12 would be received over or as part of underlying/more-inner substrate material (not shown). Conductive metal capacitor electrodes 12 and 14 may be of the same or different composition, construction, size, and/or shape relative one another, and whether existing or yet-to-be developed. An example elevational thickness range for inner conductive metal capacitor electrode 12 is from about 70 Angstroms to about 250 Angstroms, while that for outer conductive metal capacitor electrode 14 is from about 50 Angstroms to about 100 Angstroms.

Capacitor dielectric region 16 has a thickness no greater than 150 Angstroms. Further thickness limitations for different materials included as part of capacitor dielectric region 16 are provided herein, and are in addition to a maximum stated thickness for capacitor dielectric region 16. In one embodiment, the capacitor dielectric region 16 has a thickness no greater than 100 Angstroms, and in one embodiment has a thickness no greater than 75 Angstroms.

Capacitor dielectric region 16 includes a first $Al_2O_3$-comprising material 18 outward of inner electrode 12. Material 18 may comprise, consist essentially of, or consist of $Al_2O_3$, and has a thickness of from 2 Angstroms to 10 Angstroms. In one embodiment, material 18 has a thickness of from 2 Angstroms to 4 Angstroms. A $ZrO_2$-comprising material 20 is received outward of first $Al_2O_3$-comprising material 20. Material 20 may comprise, consist essentially of, or consist of $ZrO_2$, and has a thickness of from 30 Angstroms to 70 Angstroms. In one embodiment, material 20 has a thickness from 40 Angstroms to 60 Angstroms.

A second $Al_2O_3$-comprising material 22 is received outward of $ZrO_2$-comprising material 20. Material 22 may be of the same or different composition from that of material 18, and may comprise, consist essentially of, or consist of $Al_2O_3$. Second $Al_2O_3$-comprising material 22 has a thickness of from 2 Angstroms to 16 Angstroms. In one embodiment, material 22 has a thickness of from 4 Angstroms to 7 Angstroms. A $TiO_2$-comprising material 24 is received outward of second $Al_2O_3$-comprising material 22. $TiO_2$-comprising material 24 may comprise, consist essentially of, or consist of $TiO_2$, and has a thickness of from 40 Angstroms to 80 Angstroms. A sum "T" of the thicknesses of first $Al_2O_3$-comprising material 18, $ZrO_2$-comprising material 20, and second $Al_2O_3$-comprising material 22 is no greater than 70 Angstroms.

A combination of the above stated materials for dielectric region 16 in the stated order in combination with the stated thickness values for the respective largest stated ranges produces the unexpected result of capacitor dielectric region 16 having in combination a dielectric constant k of at least 35 and leakage current no greater than $1\times10^{-7}$ amps/cm$^2$ at from −1.1V to +1.1V. In one embodiment, the capacitor dielectric region 16 has a dielectric constant k of at least 40. In one embodiment, capacitor dielectric region 16 has leakage current no greater than $5\times10^{-8}$ amps/cm$^2$ at from −1.1V to +1.1V.

In the above embodiments for capacitor dielectric region 16, first $Al_2O_3$-comprising material 18 may or may not be in direct physical touching contact with inner electrode 12. Likewise, $TiO_2$-comprising material 24 may or may not be in direct physical touching contact with outer electrode 14. Accordingly, dielectric material other than $Al_2O_3$ may or may not be received between material 18 and inner capacitor electrode 12, and dielectric material other than $TiO_2$ may or may not be received between material 24 and outer capacitor electrode 14. Further in one embodiment and as shown, each of materials 18, 20, 22 and 24 is in direct physical touching contact with the immediately adjacent of such materials. However, dielectric material of different composition from that of the respective immediately adjacent of materials 18, 20, 22 and 24 may be received between any one or more of such immediately adjacent materials.

For example, a capacitor 10a is shown in FIG. 2. Like numerals from FIG. 1 have been utilized where appropriate, with some construction differences being indicated with the suffix "a" or with different numerals. In FIG. 2, an $Al_xZr_yO_z$-comprising material 26 is received between first $Al_2O_3$-comprising material 18 and $ZrO_2$-comprising material 20, and where material 18 and material 20 are in direct physical touching contact with $Al_xZr_yO_z$-comprising material 26. Where "x" is from 0.3 to 0.7, "y" is from 2.8 to 3.1 and "z" is from 6.0 to 7.4. Where "x" is from 0.1 to 0.3, "y" is from 3.0 to 3.4 and "z" is from 6.1 to 7.4. Where "x" is from 2.8 to 3.2, "y" is from 0.6 to 0.9 and "z" is from 5.3 to 6.7. Other quantities for "x", "y", and "z" falling within the respective x:y:z ratios may be used. $Al_xZr_yO_z$-comprising material 26 may comprise, consist essentially of, or consist of $Al_xZr_yO_z$. An example thickness range for $Al_xZr_yO_z$-comprising material 26 is from 2 Angstroms to 32 Angstroms.

An $Al_xZr_yO_z$-comprising material 28 is received between $ZrO_2$-comprising material 20 and second $Al_2O_3$-comprising material 22, and where material 20 and material 22 are in direct physical touching contact with $Al_xZr_yO_z$-comprising material 28. Ranges for "x", "y", and "z" are as stated above for material 26. Such may be of the same or different composition as material 26. $Al_xZr_yO_z$-comprising material 28 may comprise, consist essentially of, or consist of $Al_xZr_yO_z$. An example thickness range for $Al_xZr_yO_z$-comprising material 28 is from 2 Angstroms to 32 Angstroms.

A $Ti_xAl_yO_z$-comprising material 30 is received between second $Al_2O_3$-comprising material 22 and $TiO_2$-comprising material 24, and where material 22 and material 24 are in direct physical touching contact with $Ti_xAl_yO_z$-comprising material 30. In one embodiment, "x" is from 0.3 to 0.7, "y" is from 3.0 to 3.5 and "z" is from 5.0 to 6.8. In one embodiment, "x" is from 4 to 10, "y" is from 0.1 to 0.4 and "z" is from 8 to 20. Other quantities for "x", "y", and "z" falling within such x:y:z ratios may be used. Material 30 may comprise, consist essentially of, or consist of $Ti_xAl_yO_z$. An example thickness range for $Ti_xAl_yO_z$-comprising material 30 is from 2 Angstroms to 66 Angstroms.

Capacitor dielectric region 16a has a thickness no greater than 150 Angstroms. Further thickness limitations for different materials included as part of capacitor dielectric region 16a are provided herein, and are in addition to a maximum stated thickness for capacitor dielectric region 16a. In one embodiment, capacitor dielectric region 16a has a thickness no greater than 100 Angstroms, and in one embodiment has a thickness no greater than 75 Angstroms.

Materials other than the above-described materials 26, 28, 30 might be received intermediate immediately adjacent of materials 18, 20, 22 and 24. Regardless, provision of one or more of the above stated materials 26, 28 and 30 is expected to provide one or both of a further increase in dielectric constant k and a further reduction in leakage current for capacitor dielectric region 16a as compared to capacitor dielectric region 16.

Figure 3:
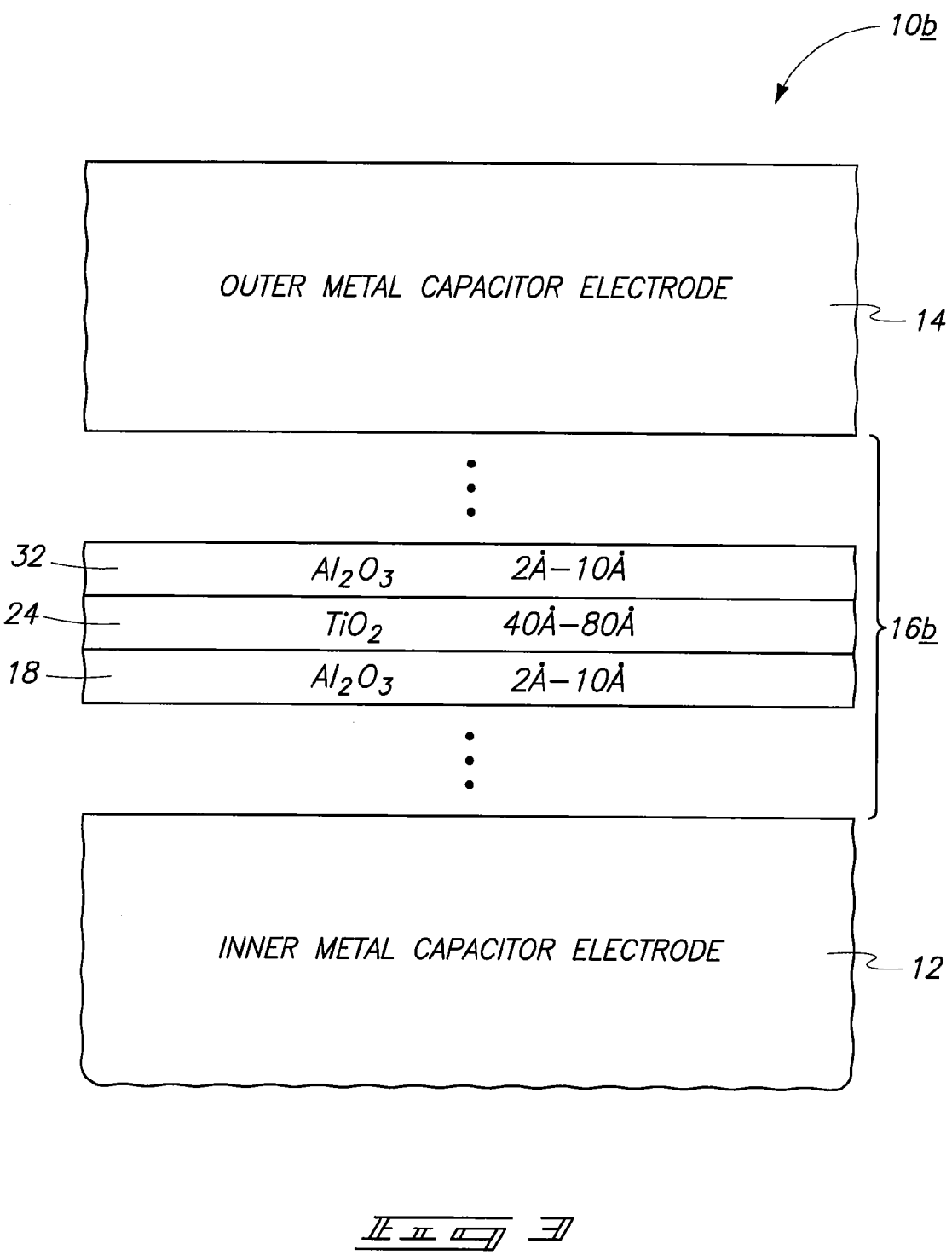
FIG. 3 is a diagrammatic cross sectional view of a capacitor construction in accordance with an embodiment of the invention.

Another embodiment capacitor 10b is described with reference to FIG. 3. Like numerals from the above-described embodiments have been utilized where appropriate, with some construction differences being indicated with the suffix "b" or with different numerals. In FIG. 3, capacitor dielectric region 16b includes first $Al_2O_3$-comprising material 18 outward of inner electrode 12, and has a thickness of from 2 Angstroms to 10 Angstroms. $TiO_2$-comprising material 24 is received outward of first $Al_2O_3$-comprising material 18, and has a thickness of from 40 Angstroms to 80 Angstroms. A second $Al_2O_3$-comprising material 32 is received outward of $TiO_2$-comprising material 24. Such may comprise, consist essentially of, or consist of $Al_2O_3$ and may or may not be of the same composition as first $Al_2O_3$ comprising material 18. Regardless, second $Al_2O_3$-comprising material 32 has a thickness of from 2 Angstroms to 10 Angstroms, and may or may not be in direct physical touching contact with outer capacitor electrode 14. In one embodiment, material 32 has a thickness of from 4 Angstroms to 7 Angstroms.

Capacitor dielectric region 16b has a thickness no greater than 150 Angstroms. Further thickness limitations for different materials included as part of capacitor dielectric region 16b are provided herein, and are in addition to a maximum stated thickness for capacitor dielectric region 16b. In one embodiment, capacitor dielectric region 16b has a thickness no greater than 100 Angstroms, and in one embodiment has a thickness no greater than 75 Angstroms.

A combination of the above stated materials for dielectric region 16b in the stated order in combination with the stated thickness values for the respective largest stated ranges produces the unexpected result of capacitor dielectric region 16b having in combination a dielectric constant k of at least 35 and leakage current no greater than $1\times10^{-7}$ amps/cm$^2$ at from −1.1V to +1.1V. In one embodiment, the capacitor dielectric region 16*b* has a dielectric constant k of at least 40. In one embodiment, capacitor dielectric region 16*b* has leakage current no greater than $5 \times 10^{-8}$ amps/cm² at from −1.1V to +1.1V.

As in the above-described embodiments, immediately adjacent of materials 18, 24 and 32 may be in direct physical touching contact with one another, or have intervening dielectric material received there-between. For example and by way of example only, material 30 (not shown in FIG. 3) could be received between one or both of material pairs 32/24 or 24/18.

Figure 4:
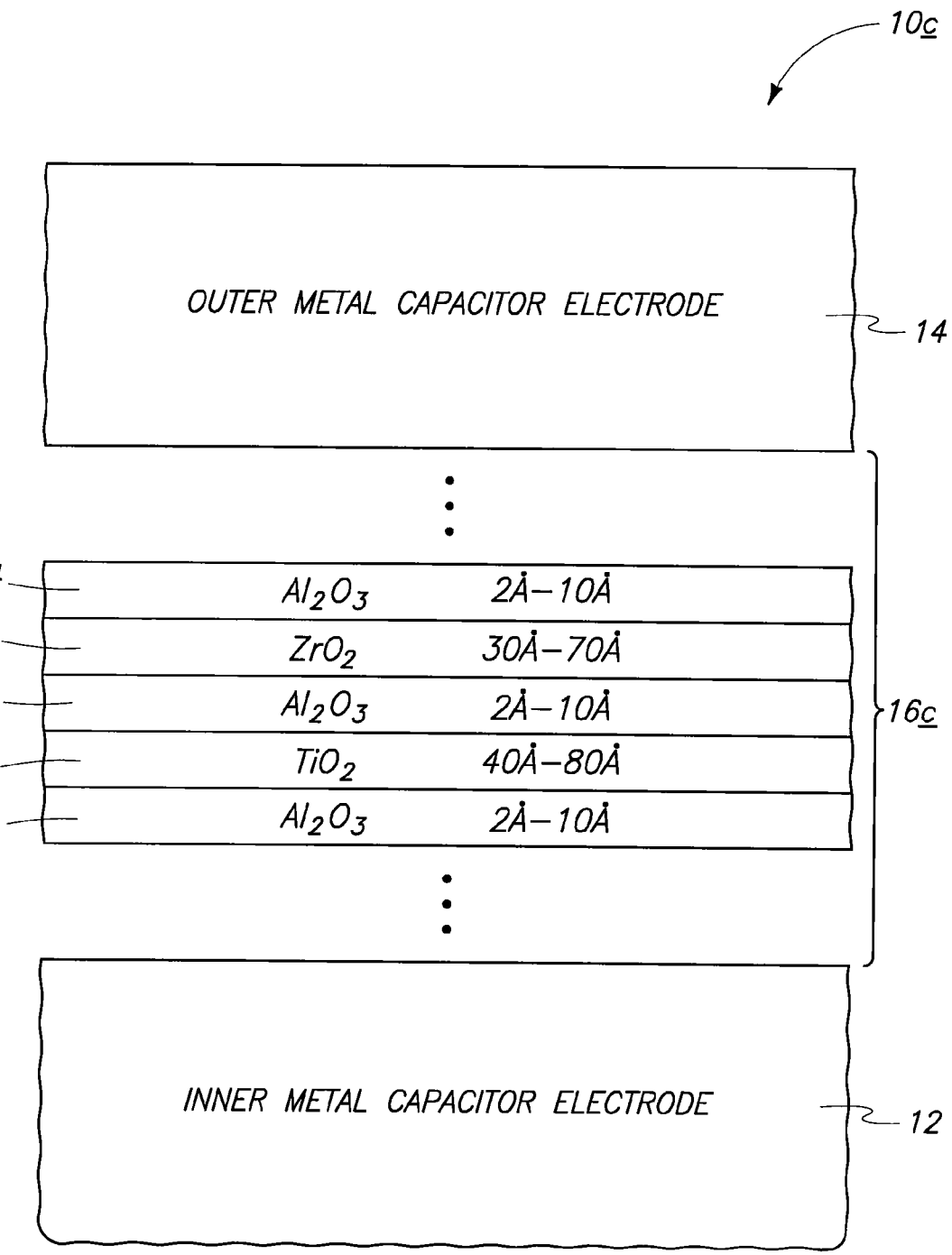
FIG. 4 is a diagrammatic cross sectional view of a capacitor construction in accordance with an embodiment of the invention.

Another capacitor 10*c* is shown in FIG. 4. Like numerals from the above-described embodiments have been utilized where appropriate, with some construction differences being indicated with the suffix "c" or with different numerals. Capacitor dielectric region 16*c* has a thickness no greater than 150 Angstroms. Further thickness limitations for different materials included as part of capacitor dielectric region 16*c* are provided herein, and are in addition to a maximum stated thickness for capacitor dielectric region 16*c*. In one embodiment, capacitor dielectric region 16*c* has a thickness no greater than 100 Angstroms, and in one embodiment has a thickness no greater than 75 Angstroms.

The capacitor of FIG. 4 is similar to that of FIG. 3, and comprises specific additional material within capacitor dielectric region 16*c* received outwardly of second Al₂O₃-comprising material 32. Specifically, ZrO₂-comprising material 20 is received outward of second Al₂O₃-comprising material 32, and has a thickness of from 30 Angstroms to 70 Angstroms. A third Al₂O₃-comprising material 34 is received outward of ZrO₂-comprising material 20, and has a thickness of from 2 Angstroms to 10 Angstroms. Third Al₂O₃-comprising material 34 may comprise, consist essentially of, or consist of Al₂O₃, and may be of the same or of different composition from that of either of materials 18 or 32. Material 34 may or may not be in direct physical touching contact with outer capacitor electrode 14. Further, third Al₂O₃-comprising material 34 may or may not be in direct physical touching contact with ZrO₂-comprising material 20, and ZrO₂-comprising material 20 may or may not be in direct physical touching contact with second Al₂O₃-comprising material 32. In one embodiment, Al$_x$Zr$_y$O$_z$ material 26 (not shown in FIG. 4) may be received between either of material pairs 32/20 and 34/20. Regardless, providing of materials 20 and 34 as shown and described is expected to provide one or both of a further increase in dielectric constant k and a further reduction in leakage current for capacitor dielectric region 16*c* as compared to capacitor dielectric region 16*b*.

Figure 5:
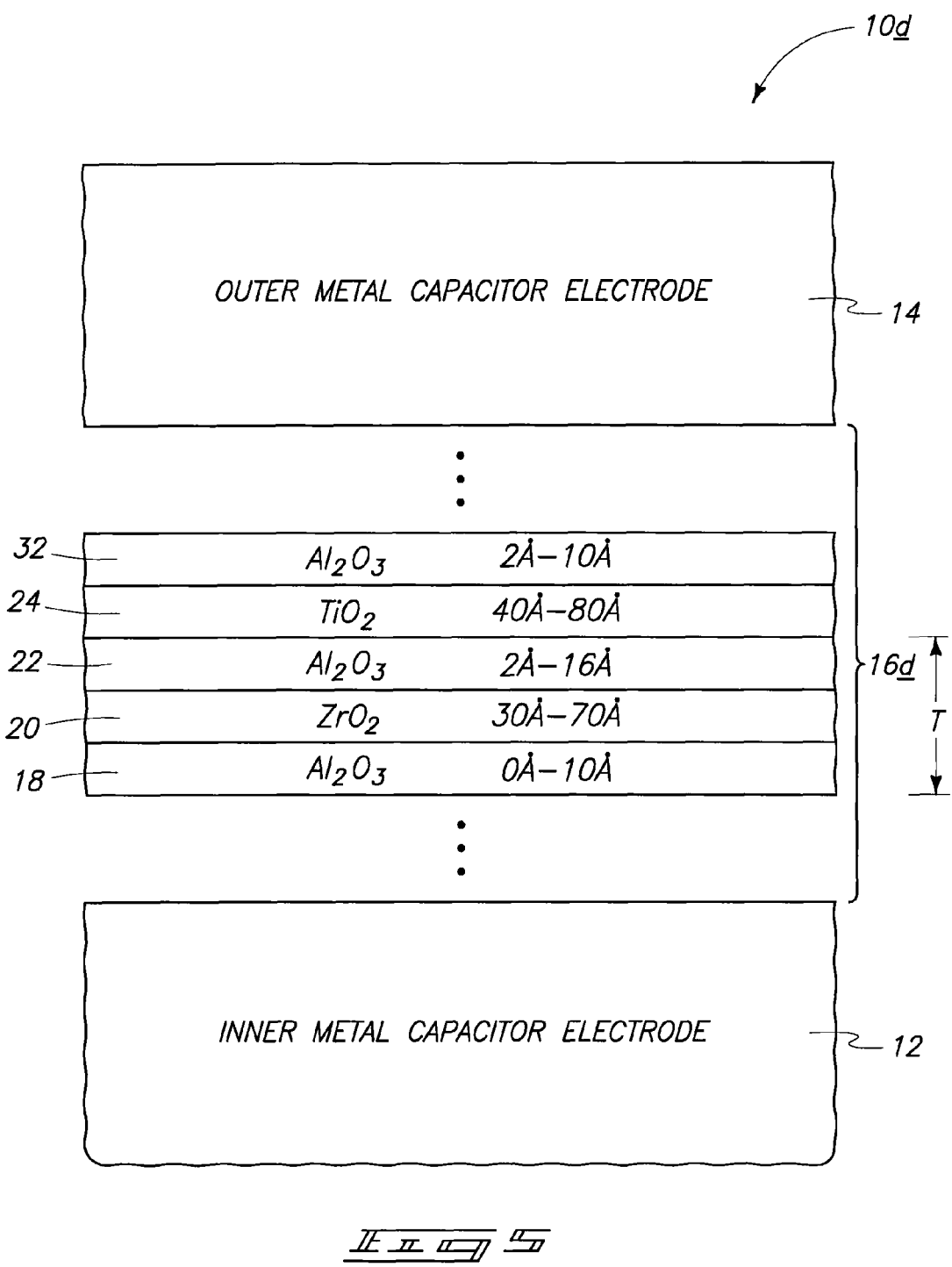
FIG. 5 is a diagrammatic cross sectional view of a capacitor construction in accordance with an embodiment of the invention.

Another embodiment capacitor 10*d* is shown in FIG. 5. Like numerals from the above-described embodiments have been utilized where appropriate, with some construction differences being indicated with the suffix "d" or with different numerals. Capacitor dielectric region 16*d* has a thickness no greater than 150 Angstroms. Further thickness limitations for different materials included as part of capacitor dielectric region 16*d* are provided herein, and are in addition to a maximum stated thickness for capacitor dielectric region 16*d*. In one embodiment, capacitor dielectric region 16*d* has a thickness no greater than 100 Angstroms, and in one embodiment has a thickness no greater than 75 Angstroms.

Capacitor dielectric region 16*d* includes optional first Al₂O₃-comprising material 18 outward of inner capacitor electrode 12, and has a thickness of from 0 Angstroms to 10 Angstroms. Accordingly, optional first Al₂O₃-comprising material 18 may be present in the capacitor construction 10*d* (as shown), or may not be present in the capacitor construction.

ZrO₂-comprising material 20 is received outward of inner capacitor electrode 12 and outward of optional first Al₂O₃-comprising material 18 if optional first Al₂O₃-comprising material 18 is present. ZrO₂-comprising material 20 has a thickness of from 30 Angstroms to 70 Angstroms. Second Al₂O₃-comprising material 22 is received outward of ZrO₂-comprising material 20, and has a thickness of from 2 Angstroms to 16 Angstroms. TiO₂-comprising material 24 is received outward of second Al₂O₃-comprising material 22, and has a thickness of from 40 Angstroms to 80 Angstroms. Third Al₂O₃-comprising material 32 is received outward of TiO₂-comprising material 24, and has a thickness of from 2 Angstroms to 10 Angstroms. A sum T of the thicknesses of optional first Al₂O₃-comprising material 18 if such is present, ZrO₂-comprising material 20, and second Al₂O₃-comprising material 22 totals no more than 70 Angstroms.

A combination of the above stated materials for dielectric region 16*d* in the stated order in combination with the stated thickness values for the respective largest stated ranges produces the unexpected result of capacitor dielectric region 16*d* having in combination a dielectric constant k of at least 35 and leakage current no greater than $1 \times 10^{-7}$ amps/cm² at from −1.1V to +1.1V. In one embodiment, the capacitor dielectric region 16*d* has a dielectric constant k of at least 40. In one embodiment, capacitor dielectric region 16*d* has leakage current no greater than $5 \times 10^{-8}$ amps/cm² at from −1.1V to +1.1V.

Materials 18, 20, 22, 24 and 32 are shown as being in direct physical touching contact relative to immediately adjacent of such materials. However, any dielectric material may be received between any pair of immediately adjacent such materials. For example, in some embodiments Al$_x$Zr$_y$O$_z$ material 26 (not shown in FIG. 5) may be received between one or both of material pairs 20/18 and 22/20. Further in some embodiments, Ti$_x$Al$_y$O$_z$ material 30 (not shown in FIG. 5) may be received between one or both of material pairs 24/22 and 32/24.

Figure 6:
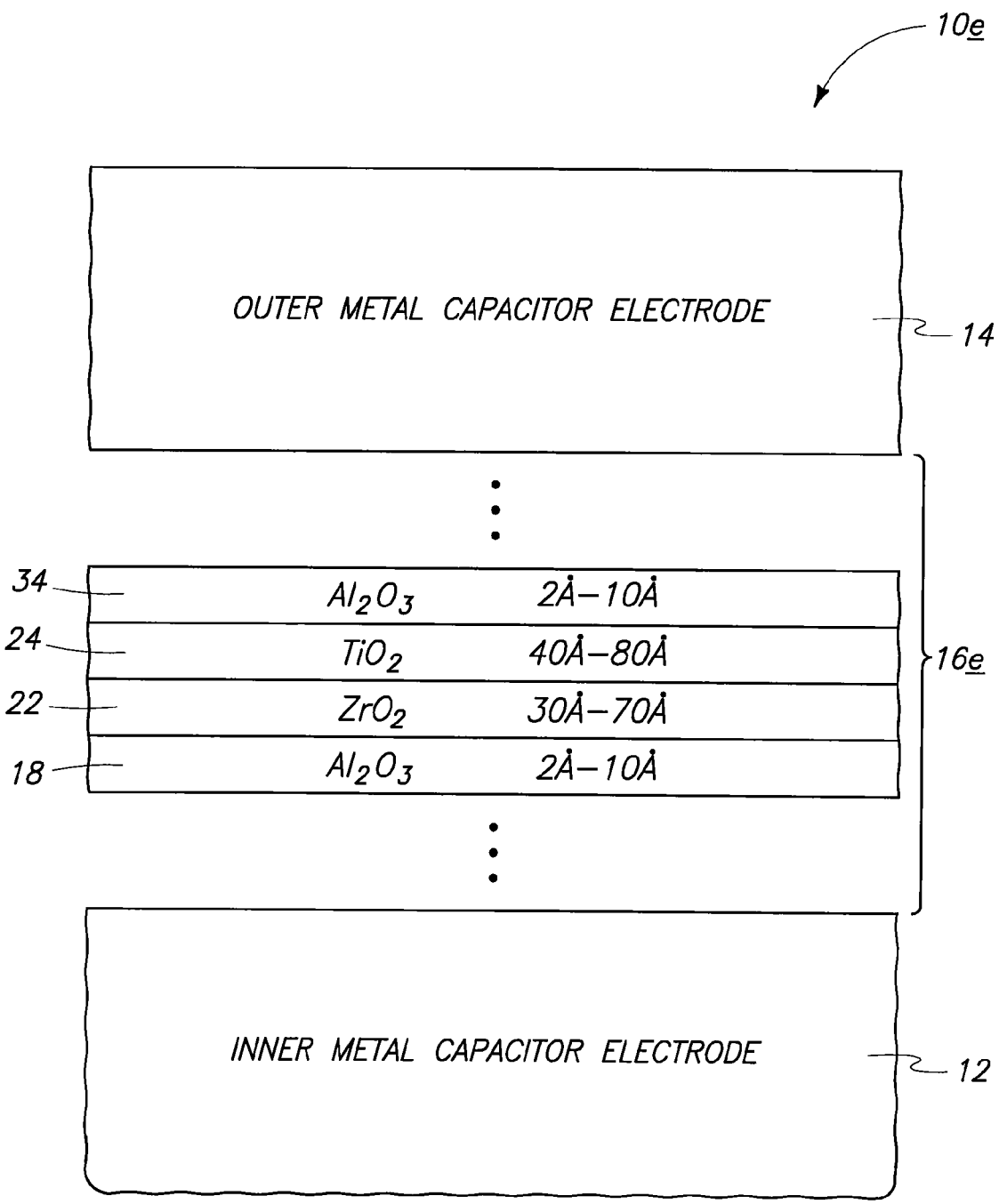
FIG. 6 is a diagrammatic cross sectional view of a capacitor construction in accordance with an embodiment of the invention.

Another capacitor construction 10*e* is shown in FIG. 6. Like numerals from the above-described embodiments have been utilized where appropriate, with some construction differences being indicated with the suffix "e" or with different numerals. Capacitor dielectric region 16*e* has a thickness no greater than 150 Angstroms. Further thickness limitations for different materials included as part of capacitor dielectric region 16*e* are provided herein, and are in addition to a maximum stated thickness for capacitor dielectric region 16*e*. In one embodiment, capacitor dielectric region 16*e* has a thickness no greater than 100 Angstroms, and in one embodiment has a thickness no greater than 75 Angstroms.

Capacitor dielectric region 16*e* includes first Al₂O₃-comprising material 18 outward of inner capacitor electrode 12, and has a thickness of from 2 Angstroms to 10 Angstroms. ZrO₂-comprising material 22 is received outward of first Al₂O₃-comprising material 18, and has a thickness of from 30 Angstroms to 70 Angstroms. TiO₂-comprising material 24 is received outward of ZrO₂-comprising material 22, and has a thickness of from 40 Angstroms to 80 Angstroms. Second Al₂O₃-comprising material 34 is received outward of TiO₂-comprising material 24, and has a thickness of from 2 Angstroms to 10 Angstroms.

A combination of the above stated materials for dielectric region 16*e* in the stated order in combination with the stated thickness values for the respective largest stated ranges produces the unexpected result of capacitor dielectric region 16*e* having in combination a dielectric constant k of at least 35 and leakage current no greater than $1 \times 10^{-7}$ amps/cm² at from −1.1V to +1.1V. In one embodiment, the capacitor dielectric region 16*e* has a dielectric constant k of at least 40. In one embodiment, capacitor dielectric region 16*e* has leakage current no greater than $5 \times 10^{-8}$ amps/cm² at from −1.1V to +1.1V.

Materials 18, 22, 24 and 34 are shown as being in direct physical touching contact relative to immediately adjacent of such materials. However, any dielectric material may be received between any pair of immediately adjacent such materials. For example, in some embodiments $Al_xZr_yO_z$ material 26 (not shown in FIG. 6) may be received between material pair 22/18. In some embodiments, $Ti_xAl_yO_z$ material 30 (not shown in FIG. 6) may be received between material pair 34/24. Further in some embodiments, a $Ti_xZr_yO_z$-comprising material (not shown in FIG. 6) may be received between material pair 24/22. Relative ratio quantities for "x", "y", and "z" in $Ti_xZr_yO_z$ are as follows. Where "x" is from 0.6 to 0.8, "y" is from 2.5 to 3.6 and "z" is from 6.1 to 8.9. Where "x" is from 0.1 to 0.3, "y" is from 3.0 to 3.4 and "z" is from 6.1 to 7.5. Where "x" is from 3.5 to 4.0, "y" is from 0.1 to 0.3 and "z" is from 7.1 to 8.7. Where "x" is from 1.0 to 2.0, "y" is from 0.2 to 0.5 and "z" is from 2.3 to 5.1. Other quantities for "x", "y", and "z" falling within the respective x:y:z ratios may be used. The $Ti_xZr_yO_z$-comprising material may comprise, consist essentially of, or consist of $Ti_xZr_yO_z$. An example thickness range for a $Ti_xZr_yO_z$-comprising material is from 2 Angstroms to 76 Angstroms.

Figure 7:
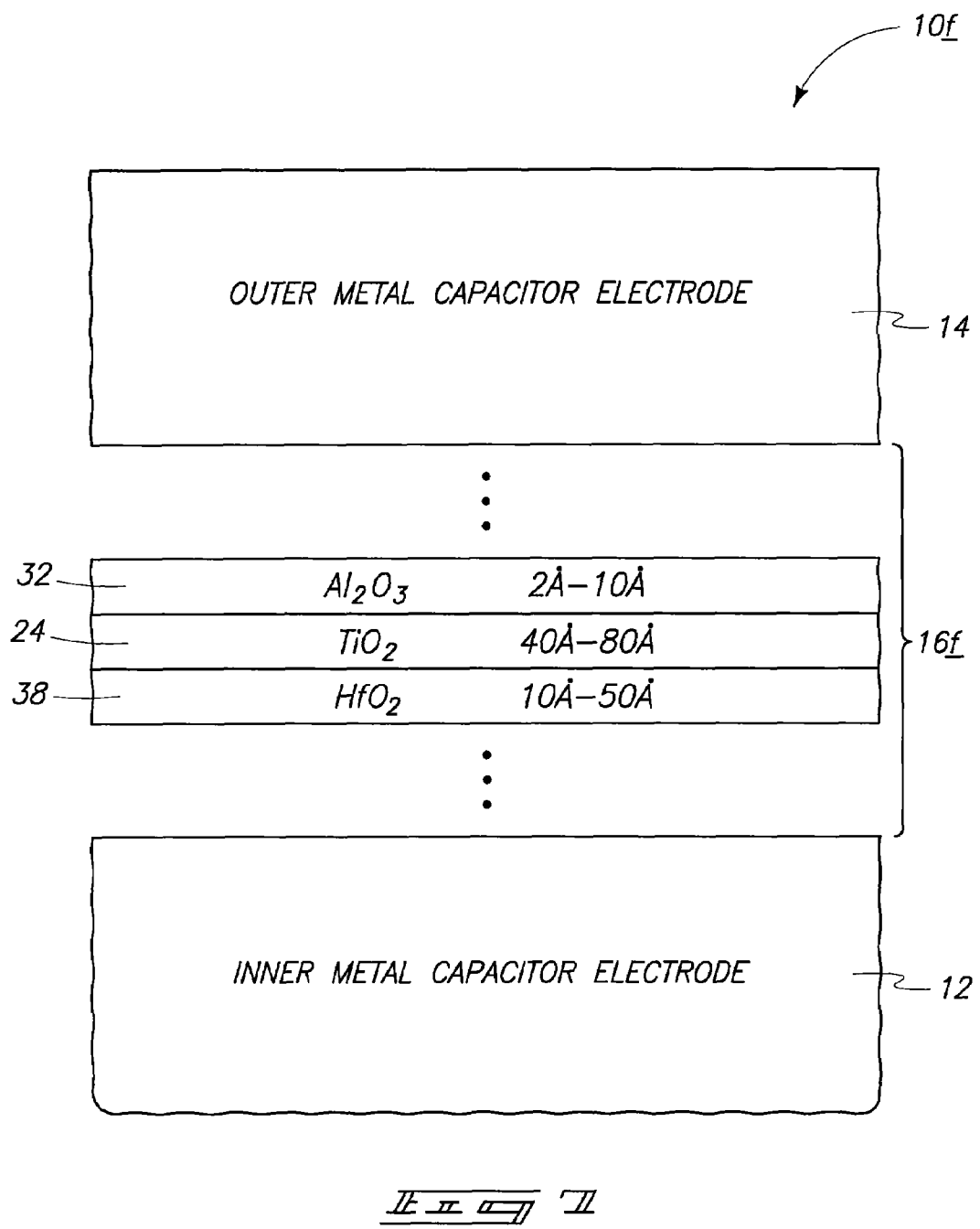
FIG. 7 is a diagrammatic cross sectional view of a capacitor construction in accordance with an embodiment of the invention.

Another capacitor construction 10f is shown in FIG. 7. Like numerals from the above-described embodiments have been utilized where appropriate, with some construction differences being indicated with the suffix "f" or with different numerals. Capacitor dielectric region 16f has a thickness no greater than 150 Angstroms. Further thickness limitations for different materials included as part of capacitor dielectric region 16f are provided herein, and are in addition to a maximum stated thickness for capacitor dielectric region 16f. In one embodiment, capacitor dielectric region 16f has a thickness no greater than 100 Angstroms, and in one embodiment has a thickness no greater than 75 Angstroms.

Capacitor dielectric region 16f includes an $HfO_2$-comprising material 38 outward of inner capacitor electrode 12, and has a thickness of from 10 Angstroms to 50 Angstroms. Material 38 may or may not be in direct physical touching contact with inner capacitor electrode 12. $TiO_2$-comprising material 24 is received outward of $HfO_2$-comprising material 38, and has a thickness of from 40 Angstroms to 80 Angstroms. $Al_2O_3$-comprising material 32 is received outward of $TiO_2$-comprising material 24, and has a thickness of from 2 Angstroms to 10 Angstroms.

A combination of the above stated materials for dielectric region 16f in the stated order in combination with the stated thickness values produces the unexpected result of capacitor dielectric region 16f having in combination a dielectric constant k of at least 35 and leakage current no greater than $1 \times 10^{-7}$ amps/cm$^2$ at from $-1.1V$ to $+1.1V$. In one embodiment, the capacitor dielectric region 16f has a dielectric constant k of at least 40. In one embodiment, capacitor dielectric region 16f has leakage current no greater than $5 \times 10^{-8}$ amps/cm$^2$ at from $-1.1V$ to $+1.1V$.

Figure 8:
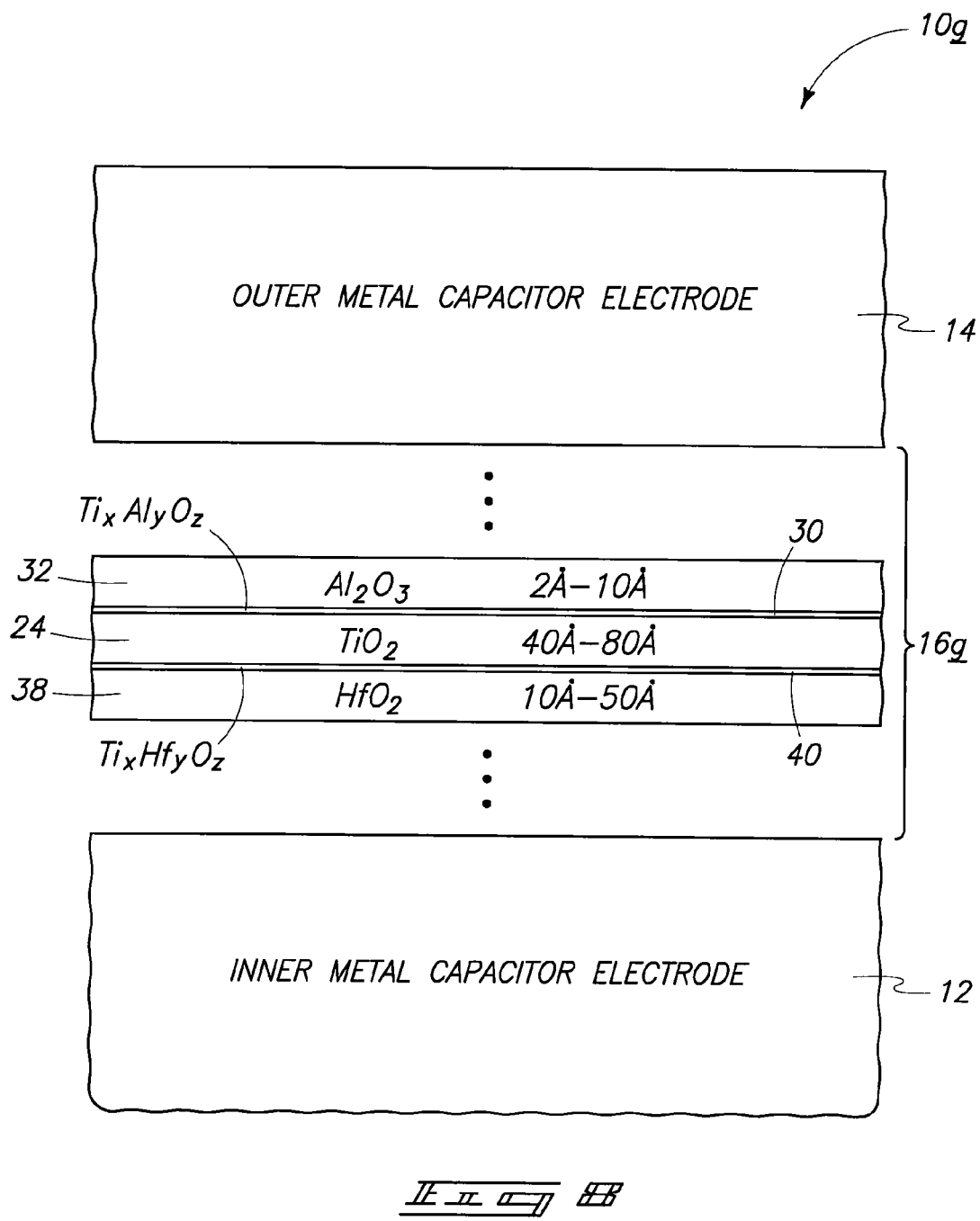
FIG. 8 is a diagrammatic cross sectional view of a capacitor construction in accordance with an embodiment of the invention.

Materials 38, 24, and 32 may be in direct physical touching contact relative to immediately adjacent of such materials, or intervening dielectric material may be received between one or both of material pairs 38/24 and 32/24. For example, another capacitor construction 10g is shown in FIG. 8. Like numerals from the above-described embodiments have been utilized where appropriate, with some construction differences being indicated with the suffix "g" or with different numerals. Capacitor dielectric region 16g has a thickness no greater than 150 Angstroms. Further thickness limitations for different materials included as part of capacitor dielectric region 16g are provided herein, and are in addition to a maximum stated thickness for capacitor dielectric region 16g. In one embodiment, capacitor dielectric region 16g has a thickness no greater than 100 Angstroms, and in one embodiment has a thickness no greater than 75 Angstroms.

In capacitor dielectric region 16g, $TiO_2$-comprising material 24 is not in direct physical touching contact with $HfO_2$-comprising material 38, rather having a material 40 received there-between. In one embodiment, such comprises a $Ti_xHf_yO_z$-comprising material, where $TiO_2$-comprising material 24 and $HfO_2$-comprising material 38 are in direct physical touching contact with $Ti_xHf_yO_z$-comprising material 40. Where "x" is from 0.6 to 0.9, "y" is from 2.8 to 3.5 and "z" is from 6.7 to 8.9. Where "x" is from 1.0 to 2.0, "y" is from 0.2 to 0.5 and "z" is from 2.3 to 5.1. Other quantities for "x", "y", and "z" falling within such x:y:z ratio may be used. Material 40 may comprise, consist essentially of, or consist of $Ti_xHf_yO_z$. An example thickness range for $Ti_xHf_yO_z$-comprising material 40 is from 2 Angstroms to 94 Angstroms. $Ti_xAl_yO_z$ material 30 is received between $Al_2O_3$-comprising material 32 and $TiO_2$-comprising material 24. Regardless, provision of one or more of the above stated materials 40 or 30 is expected to provide one or both of a further increase in dielectric constant k and a further reduction in leakage current for capacitor dielectric region 16g as compared to capacitor dielectric region 16f.

Figure 9:
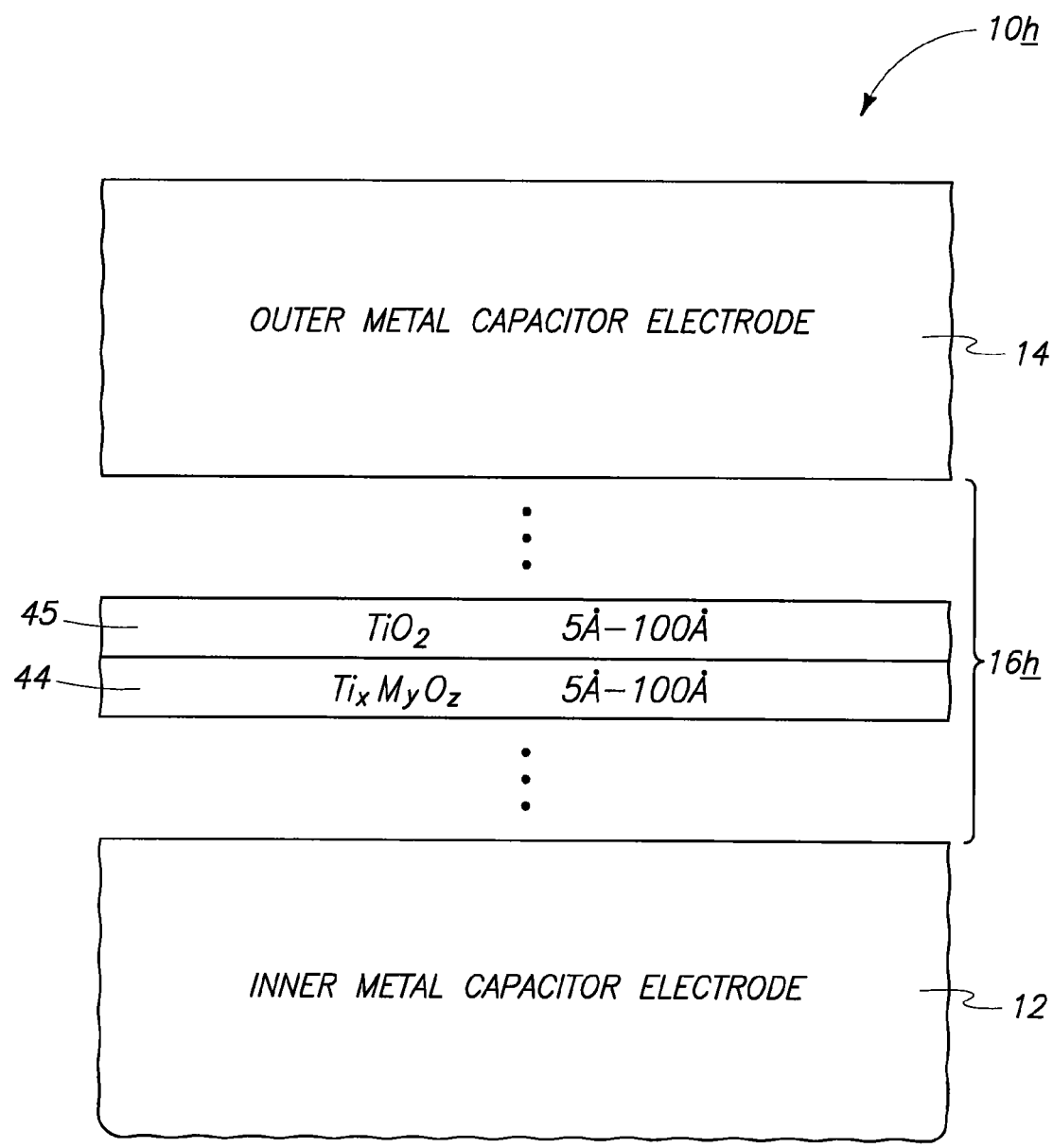
FIG. 9 is a diagrammatic cross sectional view of a capacitor construction in accordance with an embodiment of the invention.

Another capacitor construction 10h is shown in FIG. 9. Like numerals from the above-described embodiments have been utilized where appropriate, with some construction differences being indicated with the suffix "h" or with different numerals. Capacitor dielectric region 16h has a thickness no greater than 150 Angstroms. Further thickness limitations for different materials included as part of capacitor dielectric region 16h are provided herein, and are in addition to a maximum stated thickness for capacitor dielectric region 16h. In one embodiment, capacitor dielectric region 16h has a thickness no greater than 100 Angstroms, and in one embodiment has a thickness no greater than 75 Angstroms.

Capacitor dielectric region 16h includes a $Ti_xM_yO_z$-comprising material 44 outward of inner capacitor electrode 12, and has a thickness of from 5 Angstroms to 100 Angstroms. "M" is at least one of Zr, Hf, Ta, Si, Nb, or Al. Where "x" is from 0.6 to 0.9, "y" is from 2.8 to 3.5 and "z" is from 5.3 to 10.7. Other quantities for "x", "y", and "z" falling within such x:y:z ratio may be used. In one embodiment, $Ti_xM_yO_z$-comprising material 44 has a thickness of from 30 Angstroms to 75 Angstroms. $Ti_xM_yO_z$-comprising material 44 may or may not be in direct physical touching contact with inner electrode 12. A $TiO_2$-comprising material 45 is received outward of $Ti_xM_yO_z$-comprising material 44. $TiO_2$-comprising material 45 may comprise, consist essentially of, or consist of $TiO_2$, and has a thickness of from 5 Angstroms to 100 Angstroms.

A combination of the above stated materials for dielectric region 16h in the stated order in combination with the stated thickness values produces the unexpected result of capacitor dielectric region 16h having in combination a dielectric constant k of at least 35 and leakage current no greater than $1 \times 10^{-7}$ amps/cm$^2$ at from $-1.1V$ to $+1.1V$. In one embodiment, capacitor dielectric region 16h has a dielectric constant k of at least 40. In one embodiment, capacitor dielectric region 16h has leakage current no greater than $5 \times 10^{-8}$ amps/cm$^2$ at from $-1.1V$ to $+1.1V$.

Materials 45 and 44 may be in direct physical touching contact with each other, or intervening dielectric material may be received between materials 45 and 44.

Figure 10:
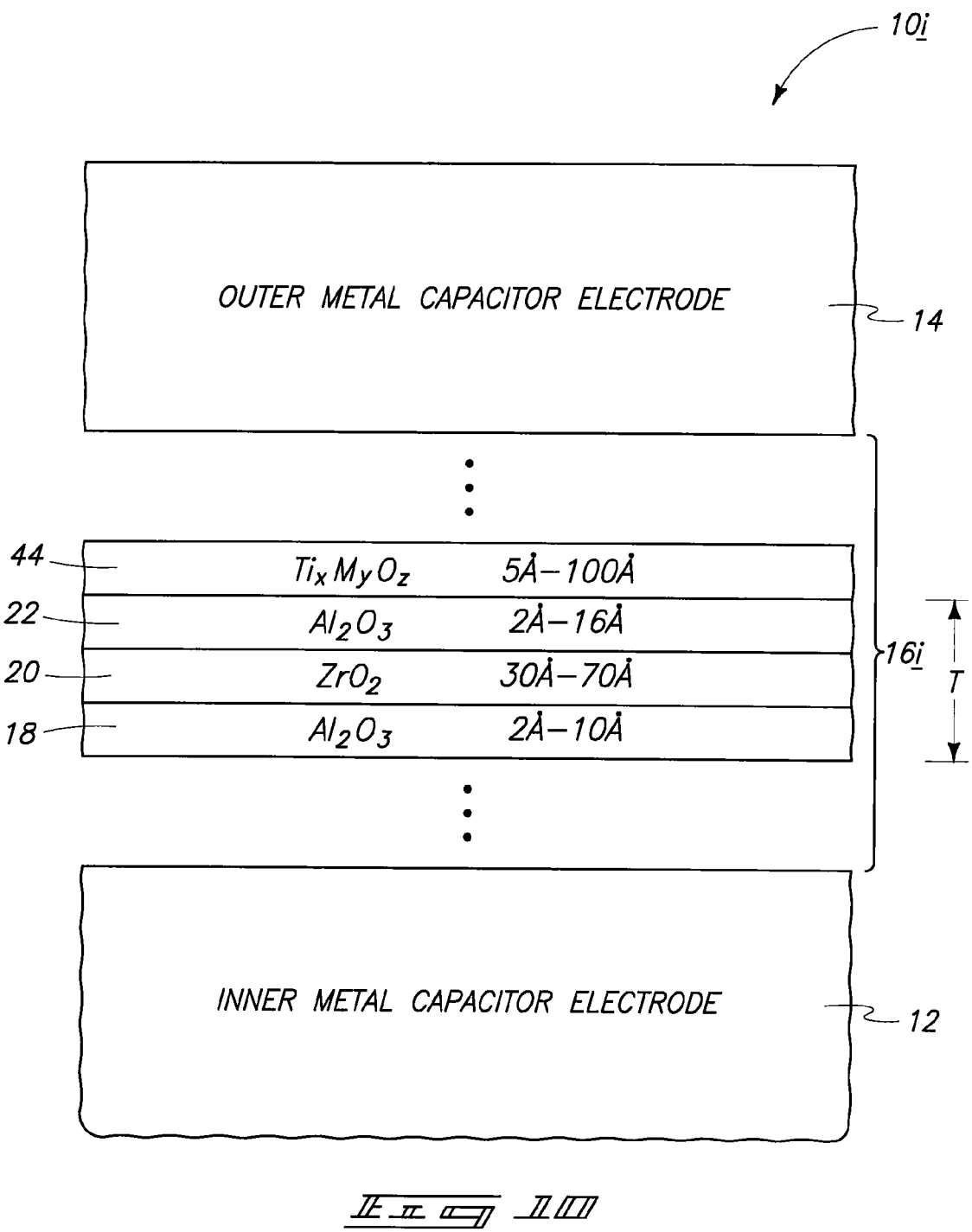
FIG. 10 is a diagrammatic cross sectional view of a capacitor construction in accordance with an embodiment of the invention.

Another capacitor construction 10i is shown in FIG. 10. Like numerals from the above-described embodiments have been utilized where appropriate, with some construction differences being indicated with the suffix "i" or with different numerals. Capacitor dielectric region 16i has a thickness no greater than 150 Angstroms. Further thickness limitations for different materials included as part of capacitor dielectric region 16i are provided herein, and are in addition to a maximum stated thickness for capacitor dielectric region 16i. In one embodiment, capacitor dielectric region 16i has a thickness no greater than 100 Angstroms, and in one embodiment has a thickness no greater than 75 Angstroms.

Capacitor dielectric region 16i includes first $Al_2O_3$-comprising material 18 outward of inner capacitor electrode 12, and has a thickness of from 2 Angstroms to 10 Angstroms. $ZrO_2$-comprising material 20 is received outward of first $Al_2O_3$-comprising material 18, and has a thickness of from 30 Angstroms to 70 Angstroms. Second $Al_2O_3$-comprising material 22 is received outward of $ZrO_2$-comprising material 20, and has a thickness of from 2 Angstroms to 16 Angstroms.

$Ti_xM_yO_z$-comprising material 44 is received outward of second $Al_2O_3$-comprising material 22, and has a thickness of from 5 Angstroms to 100 Angstroms. Material 44 may or may not be in direct physical touching contact with outer electrode 14. A sum T of the thicknesses of first $Al_2O_3$-comprising material 18, $ZrO_2$-comprising material 20, and second $Al_2O_3$-comprising material 22 totals no more than 70 Angstroms.

A combination of the above stated materials for dielectric region 16i in the stated order in combination with the stated thickness values produces the unexpected result of capacitor dielectric region 16i having in combination a dielectric constant k of at least 35 and leakage current no greater than $1\times10^{-7}$ amps/cm$^2$ at from $-1.1V$ to $+1.1V$. In one embodiment, capacitor dielectric region 16i has a dielectric constant k of at least 40. In one embodiment, capacitor dielectric region 16i has leakage current no greater than $5\times10^{-8}$ amps/cm$^2$ at from $-1.1V$ to $+1.1V$.

Immediately adjacent of materials 18, 20, 22 and 44 may be in direct physical touching contact with one another, or have intervening dielectric material received there-between. For example, material 26/30 (not shown in FIG. 10) could be received between one or both of material pairs 18/20 and 20/22. Regardless, material different from that of materials 22 and 44 could be received between materials 22 and 44.

Another capacitor construction 10j is shown in FIG. 11. Like numerals from the above-described embodiments have been utilized where appropriate, with some construction differences being indicated with the suffix "j" or with different numerals. Capacitor dielectric region 16j has a thickness no greater than 150 Angstroms. Further thickness limitations for different materials included as part of capacitor dielectric region 16j are provided herein, and are in addition to a maximum stated thickness for capacitor dielectric region 16j. In one embodiment, capacitor dielectric region 16j has a thickness no greater than 100 Angstroms, and in one embodiment has a thickness no greater than 75 Angstroms.

Capacitor dielectric region 16j includes optional first $Al_2O_3$-comprising material 18 outward of inner capacitor electrode 12, and has a thickness from 0 Angstroms to 10 Angstroms. Accordingly, capacitor construction 10j may or may not include first $Al_2O_3$-comprising material 18. A first material 46 is received outward of inner capacitor electrode 12 and outward of optional first $Al_2O_3$-comprising material 18 if such is present. First material 46 has a thickness of from 20 Angstroms to 50 Angstroms. First material 46 comprises at least one of $ZrO_2$ and $HfO_2$, including any combination or mixture thereof. First material 46 may comprise, consist essentially of, or consist of one or more of $ZrO_2$ and $HfO_2$.

An optional second $Al_2O_3$-comprising material 22 is received outward of first material 46, and has a thickness of from 0 Angstroms to 16 Angstroms. Accordingly, optional second $Al_2O_3$-comprising material 22 may or may not be present in capacitor dielectric region 16j, and independent of whether optional first $Al_2O_3$-comprising material 18 is present. $TiO_2$-comprising material 24 is received outward of first material 46 and outward of optional second $Al_2O_3$-comprising material 22 if such is present. $TiO_2$-comprising material 24 has a thickness of from 40 Angstroms to 80 Angstroms.

A second material 48 is received outward of $TiO_2$-comprising material 24, and comprises at least one of $ZrO_2$ or $HfO_2$, including any combination or mixture thereof. Such may comprise, consist essentially of, or consist of one or more of $ZrO_2$ and $HfO_2$, and may or may not be of the same composition as first material 46. Second material 48 has a thickness of from 10 Angstroms to 40 Angstroms, with a sum of the thicknesses of first material 46 and second material 48 alone totaling no more than 70 Angstroms.

Optional third $Al_2O_3$-comprising material 32 is received outward of second material 48, and has a thickness of from 0 Angstroms to 10 Angstroms. Accordingly, optional third $Al_2O_3$-comprising material 32 may or may not be present in capacitor dielectric region 16j, and independent of presence of one or both of optional first $Al_2O_3$-comprising material 18 and optional second $Al_2O_3$-comprising material 22. Accordingly, zero, one, two, or three of $Al_2O_3$-comprising materials 18, 22 and 32 may or may not be present in capacitor dielectric region 16j.

A combination of the above stated materials for dielectric region 16j in the stated order in combination with the stated thickness values produces the unexpected result of capacitor dielectric region 16j having in combination a dielectric constant k of at least 35 and leakage current no greater than $1\times10^{-7}$ amps/cm$^2$ at from $-1.1V$ to $+1.1V$. In one embodiment, capacitor dielectric region 16j has a dielectric constant k of at least 40. In one embodiment, capacitor dielectric region 16j has leakage current no greater than $5\times10^{-8}$ amps/cm$^2$ at from $-1.1V$ to $+1.1V$.

Materials 18, 46, 22, 24, 48, and 32 are shown as being in direct physical touching contact relative to immediately adjacent of such materials. However, any dielectric material may be received between any pair of immediately adjacent such materials. For example, in some embodiments $Al_xZr_yO_z$ material 26/28 (not shown in FIG. 11) may be received between any of material pairs 46/18, 46/22, and 48/32 where for example materials 46 and/or 48 comprise $ZrO_2$. In some embodiments, $Al_xHf_yO_z$ material (not shown in FIG. 11) may be received between any of material pairs 46/18, 46/22, and 48/32 where for example materials 46 and/or 48 comprise $HfO_2$. In some embodiments, $Ti_xAl_yO_z$ material 30 (not shown in FIG. 11) may be received between material pair 24/22. In some embodiments where second material 48 comprises $HfO_2$, a $Ti_xHf_yO_z$-comprising material 40 (not shown in FIG. 11) may be received between material pair 48/24.

Another capacitor construction 10k is shown in FIG. 12. Like numerals from the above-described embodiments have been utilized where appropriate, with some construction differences being indicated with the suffix "k" or with different numerals. Capacitor dielectric region 16k has a thickness no greater than 150 Angstroms. Further thickness limitations for different materials included as part of capacitor dielectric region 16k are provided herein, and are in addition to a maximum stated thickness for capacitor dielectric region 16k. In one embodiment, capacitor dielectric region 16k has a thickness no greater than 100 Angstroms, and in one embodiment has a thickness no greater than 75 Angstroms.

Capacitor dielectric region 16k includes optional first $Al_2O_3$-comprising material 18 outward of inner capacitor electrode 12, and has a thickness from 0 Angstroms to 2

Angstroms. Accordingly, capacitor construction 10k may or may not include first $Al_2O_3$-comprising material 18. $Al_xZr_yO_z$-comprising material 26 is received outward of inner capacitor electrode 12 and outward of optional first $Al_2O_3$-comprising material 18 if such is present. $Al_xZr_yO_z$-comprising material 26 has a thickness of from 2 Angstroms to 30 Angstroms.

Optional second $Al_2O_3$-comprising material 22 is received outward of $Al_xZr_yO_z$-comprising material 26, and has a thickness of from 0 Angstroms to 10 Angstroms. Accordingly, optional second $Al_2O_3$-comprising material 22 may or may not be present in capacitor dielectric region 16k, and independent of whether optional first $Al_2O_3$-comprising material 18 is present.

A first material 52 is received outward of $Al_xZr_yO_z$-comprising material 26 and outward of optional second $Al_2O_3$-comprising material 22 if optional second $Al_2O_3$-comprising material 22 is present. First material 52 comprises at least one of $ZrO_2$ or $Ti_xZr_yO_z$ or $Zr_aTi_xAl_yO_z$, including any combinations or mixtures thereof. Relative ratio quantities for "x", "y", and "z" in $Ti_xZr_yO_z$ are as follows. Where "x" is from 0.6 to 0.8, "y" is from 2.5 to 3.6 and "z" is from 6.1 to 8.9. Where "x" is from 0.1 to 0.3, "y" is from 3.0 to 3.4 and "z" is from 6.1 to 7.4. Where "x" is from 3.5 to 4.0, "y" is from 0.1 to 0.3 and "z" is from 7.1 to 8.7. Where "x" is from 1.0 to 2.0, "y" is from 0.2 to 0.5 and "z" is from 2.3 to 5.1. Other quantities for "x", "y", and "z" falling within the respective x:y:z ratios may be used. Relative ratio quantities for "a", "x", "y", and "z" in $Zr_aTi_xAl_yO_z$ are as follows. Where "a" is from 0.1 to 0.5, "x" is from 0.2 to 2.0, "y" is from 0.01 to 0.1 and "z" is from 0.8 to 5.2. Other quantities for "a", "x", "y", and "z" falling within the respective a:x:y:z ratios may be used. First material 52 has a thickness of from 30 Angstroms to 60 Angstroms. First material 52 may comprise, consist essentially of, or consist of one or more of $ZrO_2$ or $Ti_xZr_yO_z$ or $Zr_aTi_xAl_yO_z$. During formation of capacitor dielectric region 16k, first material 52 may or may not be annealed prior to deposition of any material thereover. If annealed, an example annealing temperature range is from about 400° C. to about 650° C., and an example time range for such annealing is from about 10 seconds to about 300 seconds. Plasma may or may not be used.

Optional third $Al_2O_3$-comprising material 32 is received outward of first material 52, and has a thickness of from 0 Angstroms to 4 Angstroms. Accordingly, optional third $Al_2O_3$-comprising material 32 may or may not be present in capacitor dielectric region 16k, and independent of whether optional first $Al_2O_3$-comprising material 18 or whether optional second $Al_2O_3$-comprising material 22 are present.

A second material 54 is received outward of first material 52 comprising at least one of $ZrO_2$ or $Ti_xZr_yO_z$ or $Zr_aTi_xAl_yO_z$ and outward of optional third $Al_2O_3$-comprising material 32 if optional third $Al_2O_3$-comprising material 32 is present. Second material 54 comprises at least one of $TiO_2$ or $Ti_xZr_yO_z$ or $Zr_aTi_xAl_yO_z$, including any combinations or mixtures thereof. Example materials for $Ti_xZr_yO_z$ and $Zr_aTi_xAl_yO_z$ are those as described above for capacitor dielectric region 16k. Second material 54 has a thickness of from 10 Angstroms to 70 Angstroms. Second material 54 may comprise, consist essentially of, or consist of one or more of $ZrO_2$ or $Ti_xZr_yO_z$ or $Zr_aTi_xAl_yO_z$. During formation of capacitor dielectric region 16k, second material 54 may or may not be annealed prior to deposition of any material thereover. If annealed, example conditions include those described above for annealing first material 52.

An optional fourth $Al_2O_3$-comprising material 56 is received outward of second material 54, and has a thickness of from 0 Angstroms to 4 Angstroms. Accordingly, optional fourth $Al_2O_3$-comprising material 56 may or may not be present in capacitor dielectric region 16k, and independent of whether optional first $Al_2O_3$-comprising material 18, whether optional second $Al_2O_3$-comprising material 22, or whether optional third $Al_2O_3$-comprising material 32 are present. Accordingly, zero, one, two, three, or four of $Al_2O_3$-comprising materials 18, 22, 32, and 56 may or may not be present in capacitor dielectric region 16k.

A combination of the above stated materials for dielectric region 16k in the stated order in combination with the stated thickness values produces the unexpected result of capacitor dielectric region 16k having in combination a dielectric constant k of at least 35 and leakage current no greater than $1\times10^{-7}$ amps/cm$^2$ at from −1.1V to +1.1V. In one embodiment, capacitor dielectric region 16k has a dielectric constant k of at least 40. In one embodiment, capacitor dielectric region 16k has leakage current no greater than $5\times10^{-8}$ amps/cm$^2$ at from −1.1V to +1.1V.

Materials 18, 26, 22, 52, 32, 54, and 56 are shown as being in direct physical touching contact relative to immediately adjacent of such materials. However, any dielectric material may be received between any pair of immediately adjacent such materials.

Embodiments of the invention also encompass various methods of forming capacitors encompassing any existing or yet-to-be-developed deposition and anneal techniques. Such encompass depositing inner conductive metal capacitor electrode material over a suitable substrate, for example a semiconductor substrate. Example materials include any of those described above with respect to inner conductive metal capacitor electrode 12. A capacitor dielectric region is formed outward of the inner conductive metal capacitor electrode material to a thickness no greater than 150 Angstroms, to have a dielectric constant k of at least 35, and to have leakage current no greater than $1\times10^{-7}$ amps/cm$^2$ at from −1.1V to +1.1V.

In one embodiment, the forming of the capacitor dielectric region includes depositing an amorphous $ZrO_2$-comprising material to a thickness no greater than 35 Angstroms outward of the inner conductive metal capacitor electrode material. The $ZrO_2$-comprising material formed outward of the inner conductive metal capacitor electrode material may or may not be in direct physical touching contact therewith. The amorphous $ZrO_2$-comprising material is annealed after its deposition to form crystalline $ZrO_2$-comprising material having a thickness no greater than 35 Angstroms. Such annealing may or may not be conducted in an inert atmosphere, and may or may not be subatmospheric. An example annealing ambient is any of air, Ar, $N_2$, $O_2$, $O_3$, and any combination or sub-combinations thereof. An example annealing temperature range is from about 400° C. to about 650° C., and an example time range for such annealing is from about 10 seconds to about 300 seconds. Plasma may or may not be used.

After the annealing of the amorphous $ZrO_2$-comprising material, an $Al_2O_3$-comprising material is deposited outward of the crystalline $ZrO_2$-comprising material, and to have a thickness of from 2 Angstroms to 16 Angstroms. The $Al_2O_3$-comprising material formed over the crystalline $ZrO_2$-comprising material may or may not be in direct physical touching contact therewith. In one embodiment, an $Al_xZr_yO_z$-comprising material is provided between such $Al_2O_3$-comprising material and the crystalline $ZrO_2$-comprising material, with the $Al_2O_3$-comprising material and the $ZrO_2$-comprising material there-under being in direct physical touching contact with the $Al_xZr_yO_z$-comprising material.

An amorphous TiO$_2$-comprising material is deposited to a thickness no greater than 50 Angstroms outward of the Al$_2$O$_3$-comprising material. The amorphous TiO$_2$-comprising material having thickness no greater than 50 Angstroms may or may not be in direct physical touching contact therewith. Regardless, such amorphous TiO$_2$-comprising material is annealed in the presence of oxygen after its deposition to form crystalline TiO$_2$-comprising material. The oxygen may be provided in the form of O$_2$, O$_3$, and/or by compounds which include oxygen and other elements. Example anneal conditions include those described above for the anneal of the ZrO$_2$-comprising material.

After the annealing of the amorphous TiO$_2$-comprising material, an outer conductive metal capacitor electrode material is deposited outward of the crystalline TiO$_2$-comprising material. Example materials include any of those described above with respect to capacitor electrodes 12 and 14.

A combination of the above stated processing steps for the capacitor dielectric region in the stated order in combination with the stated thickness values produces the unexpected result of the capacitor dielectric region having in combination a dielectric constant k of at least 35 and leakage current no greater than $1 \times 10^{-7}$ amps/cm$^2$ at from $-1.1$V to $+1.1$V. In one embodiment, the capacitor dielectric region has a dielectric constant k of at least 40. In one embodiment, the capacitor dielectric region has leakage current no greater than $5 \times 10^{-8}$ amps/cm$^2$ at from $-1.1$V to $+1.1$V.

In one embodiment including the above described method, an intervening Al$_2$O$_3$-comprising material may be deposited outward of the inner conductive metal capacitor electrode material prior to the depositing of the amorphous ZrO$_2$-comprising material, and to a thickness of from 2 Angstroms to 10 Angstroms, and in one embodiment to a thickness of from 2 Angstroms to 4 Angstroms. In such event, a sum of the thicknesses of the intervening Al$_2$O$_3$-comprising material, the crystalline ZrO$_2$-comprising material, and the Al$_2$O$_3$-comprising material deposited over the crystalline ZrO$_2$-comprising material totals no more than 70 Angstroms.

The intervening Al$_2$O$_3$-comprising material may or may not be in direct physical touching contact with the crystalline ZrO$_2$-comprising material. In one embodiment, an Al$_x$Zr$_y$O$_z$-comprising material is provided between the intervening Al$_2$O$_3$-comprising material and the crystalline ZrO$_2$-comprising material, with the intervening Al$_2$O$_3$-comprising material and the ZrO$_2$-comprising material being in direct physical touching contact with the Al$_x$Zr$_y$O$_z$-comprising material. Any of the above Al$_x$Zr$_y$O$_z$-comprising materials are examples.

The crystalline TiO$_2$-comprising material may or may not be in direct physical touching contact with the Al$_2$O$_3$-comprising material formed thereover. In one embodiment, a Ti$_x$Al$_y$O$_z$-comprising material is provided between such Al$_2$O$_3$-comprising material and the crystalline TiO$_2$-comprising material. In one embodiment, such Al$_2$O$_3$-comprising material and the crystalline TiO$_2$-comprising material are in direct physical touching contact with the Ti$_x$Al$_y$O$_z$-comprising material. Any of the Ti$_x$Al$_y$O$_z$-comprising materials described above are examples.

Another Al$_2$O$_3$-comprising material may be deposited outward of the crystalline TiO$_2$-comprising material prior to the depositing of the outer conductive metal capacitor electrode material, and to have a thickness of from 2 Angstroms to 10 Angstroms. Such may or may not be formed in direct physical touching contact with the crystalline TiO$_2$-comprising material. In one embodiment, a Ti$_x$Al$_y$O$_z$-comprising material is provided between such another/outer Al$_2$O$_3$-comprising material and the crystalline TiO$_2$-comprising material. In one embodiment, such another/outer Al$_2$O$_3$-comprising material and the crystalline TiO$_2$-comprising material are provided in direct physical touching contact with the Ti$_x$Al$_y$O$_z$-comprising material.

In additional embodiments, processing may proceed as described in the above methods through the depositing of the Al$_2$O$_3$-comprising material outward of the crystalline ZrO$_2$-comprising material, and to have a thickness of from 2 Angstroms to 16 Angstroms. Then, an amorphous TiO$_2$-comprising material is deposited to a thickness greater than 50 Angstroms outward of the Al$_2$O$_3$-comprising material having thickness of from 2 Angstroms to 16 Angstroms. In such event, the outer conductive metal capacitor electrode material is then deposited outward of the TiO$_2$-comprising material at a temperature which transforms the amorphous TiO$_2$-comprising material to be crystalline during such act of depositing the outer conductive metal capacitor electrode material. For example, exposure to a temperature of at least 500° C. for at least 1 minute occurring during deposition of the outer conductive metal capacitor electrode material will achieve such amorphous-to-crystalline phase transformation of a TiO$_2$-comprising material having thickness greater than 50 Angstroms.

Alternately in such additional embodiments, the outer conductive metal capacitor electrode material is deposited outward of the TiO$_2$-comprising material at a temperature which does not transform the TiO$_2$-comprising material to be crystalline during such act of depositing the outer conductive metal capacitor electrode material. After deposition of the outer conductive metal capacitor electrode material, the substrate is then exposed to a temperature to transform the amorphous TiO$_2$-comprising material having thickness greater than 50 Angstroms to be crystalline. Example anneal conditions include exposure to a temperature of at least 500° C. for at least 1 minute.

A combination of the above stated processing steps in such additional embodiments for the capacitor dielectric region in the stated order in combination with the stated thickness values produces the unexpected result of the capacitor dielectric region having in combination a dielectric constant k of at least 35 and leakage current no greater than $1 \times 10^{-7}$ amps/cm$^2$ at from $-1.1$V to $+1.1$V. In one embodiment, the capacitor dielectric region has a dielectric constant k of at least 40. In one embodiment, the capacitor dielectric region has leakage current no greater than $5 \times 10^{-8}$ amps/cm$^2$ at from $-1.1$V to $+1.1$V. Further, one or both of an intervening Al$_2$O$_3$-comprising material and outer/another Al$_2$O$_3$-comprising material might also be deposited in such additional embodiments as described above.

In a further embodiment, the forming of the capacitor dielectric region includes depositing a first Al$_2$O$_3$-comprising material outward of the inner conductive metal capacitor electrode material, and to have a thickness of from 2 Angstroms to 10 Angstroms. Such first Al$_2$O$_3$-comprising material may or may not be in direct physical touching contact with the inner conductive metal capacitor electrode material. Example first Al$_2$O$_3$-comprising material includes any of those described above for materials 18, 22 and 32.

A TiO$_2$-comprising material is deposited outward of the first Al$_2$O$_3$-comprising material, and to a thickness of from 40 Angstroms to 80 Angstroms. Example materials include those described above for material 20. Such may or may not be in direct physical touching contact with the first Al$_2$O$_3$-comprising material. In one embodiment, a Ti$_x$Al$_y$O$_z$-comprising material is provided between the first Al$_2$O$_3$-comprising material and the TiO$_2$-comprising material. In one embodiment, the first Al$_2$O$_3$-comprising material and the TiO$_2$-comprising material are provided in direct physical touching contact with such Ti$_x$Al$_y$O$_z$-comprising material.

A second Al$_2$O$_3$-comprising material is deposited outward of the TiO$_2$-comprising material, and to have a thickness of from 2 Angstroms to 10 Angstroms. Examples include any of those described above for materials 18/22/32. The second Al$_2$O$_3$-comprising material may or may not be in direct physical touching contact with the TiO$_2$-comprising material. In one embodiment, a Ti$_x$Al$_y$O$_z$-comprising material is provided between the second Al$_2$O$_3$-comprising material and the TiO$_2$-comprising material. In one embodiment, the second Al$_2$O$_3$-comprising material and the TiO$_2$-comprising material are provided in direct physical touching contact with such Ti$_x$Al$_y$O$_z$-comprising material.

An amorphous ZrO$_2$-comprising material is deposited to a thickness no greater than 35 Angstroms outward of the second Al$_2$O$_3$-comprising material. The amorphous ZrO$_2$-comprising material is annealed after its deposition to form crystalline ZrO$_2$-comprising material having a thickness of no greater than 35 Angstroms. Example anneal conditions include those described above. The ZrO$_2$-comprising material may or may not be in direct physical touching contact with the second Al$_2$O$_3$-comprising material. In one embodiment, an Al$_x$Zr$_y$O$_z$-comprising material is provided between the ZrO$_2$-comprising material and the second Al$_2$O$_3$-comprising material. In one embodiment, the ZrO$_2$-comprising material and the second Al$_2$O$_3$-comprising material are provided in direct physical touching contact with such Al$_x$Zr$_y$O$_z$-comprising material.

After the annealing of the amorphous ZrO$_2$-comprising material, an outer conductive metal capacitor electrode material is deposited outward of the crystalline ZrO$_2$-comprising material. Example materials include any of those described above with respect to capacitor electrodes 12 and 14.

A combination of the above-stated processing steps for the capacitor dielectric region in the further stated embodiments in the stated order in combination with the stated thickness values produces the unexpected result of the capacitor dielectric region having in combination a dielectric constant k of at least 35 and leakage current no greater than $1 \times 10^{-7}$ amps/cm$^2$ at from −1.1V to +1.1V. In one embodiment, the capacitor dielectric region has a dielectric constant k of at least 40. In one embodiment, the capacitor dielectric region has leakage current no greater than $5 \times 10^{-8}$ amps/cm$^2$ at from −1.1V to +1.1V.

Another Al$_2$O$_3$-comprising material may be deposited outward of the crystalline ZrO$_2$-comprising material prior to the depositing of the outer conductive metal capacitor electrode material, and to have a thickness of from 2 Angstroms to 10 Angstroms. Such may or may not be formed in direct physical touching contact with the crystalline ZrO$_2$-comprising material. In one embodiment, an Al$_x$Zr$_y$O$_z$-comprising material is provided between such another/outer Al$_2$O$_3$-comprising material and the crystalline ZrO$_2$-comprising material. In one embodiment, such another/outer Al$_2$O$_3$-comprising material and the crystalline ZrO$_2$-comprising material are provided in direct physical touching contact with the Al$_x$Zr$_y$O$_z$-comprising material.

In additional further embodiments, processing may proceed as described above through the depositing of the second Al$_2$O$_3$-comprising material outward of the TiO$_2$-comprising material, and to have a thickness of from 2 Angstroms to 16 Angstroms. Then, an amorphous ZrO$_2$-comprising material is deposited to a thickness greater than 35 Angstroms outward of the second Al$_2$O$_3$-comprising material. In such event, the outer conductive metal capacitor electrode material is then deposited outward of the ZrO$_2$-comprising material at a temperature which transforms the amorphous ZrO$_2$-comprising material to be crystalline during such act of depositing the outer conductive metal capacitor electrode material. For example, exposure to a temperature of at least 500° C. for at least 1 minute occurring during deposition of the outer conductive metal capacitor electrode material will achieve such amorphous-to-crystalline phase transformation of a ZrO$_2$-comprising material having thickness greater than 35 Angstroms.

Alternately in such additional further embodiments, the outer conductive metal capacitor electrode material is deposited outward of the ZrO$_2$-comprising material at a temperature which does not transform the ZrO$_2$-comprising material to be crystalline during such act of depositing the outer conductive metal capacitor electrode material. After deposition of the outer conductive metal capacitor electrode material, the substrate is then exposed to a temperature to transform the amorphous ZrO$_2$-comprising material having thickness greater than 35 Angstroms to be crystalline. Example anneal conditions include exposure to a temperature of at least 500° C. for at least 1 minute.

A combination of the above-stated processing steps for the capacitor dielectric region in the last stated embodiments in the stated order in combination with the stated thickness values produces the unexpected result of the capacitor dielectric region having in combination a dielectric constant k of at least 35 and leakage current no greater than $1 \times 10^{-7}$ amps/cm$^2$ at from −1.1V to +1.1V. In one embodiment, the capacitor dielectric region has a dielectric constant k of at least 40. In one embodiment, the capacitor dielectric region has leakage current no greater than $5 \times 10^{-8}$ amps/cm$^2$ at from −1.1V to +1.1V.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A capacitor comprising:
   an inner conductive metal capacitor electrode and an outer conductive metal capacitor electrode; and
   a capacitor dielectric region received between the inner and the outer conductive metal capacitor electrodes and having a thickness no greater than 150 Angstroms, the capacitor dielectric region comprising:
   a first Al$_2$O$_3$-comprising material outward of the inner electrode, the first Al$_2$O$_3$-comprising material having a thickness of from 2 Angstroms to 10 Angstroms;
   a ZrO$_2$-comprising material outward of the first Al$_2$O$_3$-comprising material, the ZrO$_2$-comprising material having a thickness of from 30 Angstroms to 70 Angstroms;
   a second Al$_2$O$_3$-comprising material outward of the ZrO$_2$-comprising material, the second Al$_2$O$_3$-comprising material having a thickness of from 2 Angstroms to 16 Angstroms;
   a TiO$_2$-comprising material outward of the second Al$_2$O$_3$-comprising material, the TiO$_2$-comprising material having a thickness of from 40 Angstroms to 80 Angstroms; and
   a sum of the thicknesses of the first Al$_2$O$_3$-comprising material, the ZrO$_2$-comprising material, and the second Al$_2$O$_3$-comprising material totals no more than 70 Angstroms; the capacitor dielectric region having in combination a dielectric constant k of at least 35 and leakage current no greater than $1\times10^{-7}$ amps/cm$^2$ at from $-1.1V$ to $+1.1V$.

2. The capacitor of claim 1 wherein the capacitor dielectric region has a thickness no greater than 100 Angstroms.

3. The capacitor of claim 2 wherein the capacitor dielectric region has a thickness no greater than 75 Angstroms.

4. The capacitor of claim 1 wherein the capacitor dielectric region has a dielectric constant k of at least 40.

5. The capacitor of claim 1 wherein the capacitor dielectric region has leakage current no greater than $5\times10^{-8}$ amps/cm$^2$ at from $-1.1V$ to $+1.1V$.

6. The capacitor of claim 1 wherein the first $Al_2O_3$-comprising material is in direct physical touching contact with the inner electrode.

7. The capacitor of claim 1 wherein the $ZrO_2$-comprising material is in direct physical touching contact with the first $Al_2O_3$-comprising material.

8. The capacitor of claim 1 wherein the $ZrO_2$-comprising material is not in direct physical touching contact with the first $Al_2O_3$-comprising material.

9. The capacitor of claim 8 comprising an $Al_xZr_yO_z$-comprising material received between the first $Al_2O_3$-comprising material and the $ZrO_2$-comprising material, the first $Al_2O_3$-comprising material and the $ZrO_2$-comprising material being in direct physical touching contact with the $Al_xZr_yO_z$-comprising material.

10. The capacitor of claim 1 wherein the second $Al_2O_3$-comprising material is in direct physical touching contact with the $ZrO_2$-comprising material.

11. The capacitor of claim 1 wherein the second $Al_2O_3$-comprising material is not in direct physical touching contact with the $ZrO_2$-comprising material.

12. The capacitor of claim 11 comprising an $Al_xZr_yO_z$-comprising material received between the $ZrO_2$-comprising material and the second $Al_2O_3$-comprising material, the $ZrO_2$-comprising material and the second $Al_2O_3$-comprising material being in direct physical touching contact with the $Al_xZr_yO_z$-comprising material.

13. The capacitor of claim 1 wherein the $TiO_2$-comprising material is in direct physical touching contact with the outer electrode.

14. The capacitor of claim 1 wherein the $TiO_2$-comprising material is in direct physical touching contact with the second $Al_2O_3$-comprising material.

15. The capacitor of claim 1 wherein the $TiO_2$-comprising material is not in direct physical touching contact with the second $Al_2O_3$-comprising material.

16. The capacitor of claim 15 comprising a $Ti_xAl_yO_z$-comprising material received between the second $Al_2O_3$-comprising material and the $TiO_2$-comprising material, the second $Al_2O_3$-comprising material and the $TiO_2$-comprising material being in direct physical touching contact with the $Ti_xAl_yO_z$-comprising material.

17. The capacitor of claim 1 wherein the second $Al_2O_3$-comprising material is of different composition from that of the first $Al_2O_3$-comprising material.

18. A capacitor comprising:
an inner conductive metal capacitor electrode and an outer conductive metal capacitor electrode; and
a capacitor dielectric region received between the inner and the outer conductive metal capacitor electrodes and having a thickness no greater than 150 Angstroms, the capacitor dielectric region comprising:
a first $Al_2O_3$-comprising material outward of the inner electrode, the first $Al_2O_3$-comprising material having a thickness of from 2 Angstroms to 10 Angstroms;
a $TiO_2$-comprising material outward of the first $Al_2O_3$-comprising material, the $TiO_2$-comprising material having a thickness of from 40 Angstroms to 80 Angstroms;
a second $Al_2O_3$-comprising material outward of the $TiO_2$-comprising material, the second $Al_2O_3$-comprising material having a thickness of from 2 Angstroms to 10 Angstroms;
an $Al_xZr_yO_z$-comprising material received between at least one of a) the first $Al_2O_3$-comprising material and the $TiO_2$-comprising material, and b) the second $Al_2O_3$-comprising material and the $TiO_2$-comprising material; and
the capacitor dielectric region having in combination a dielectric constant k of at least 35 and leakage current no greater than $1\times10^{-7}$ amps/cm$^2$ at from $-1.1V$ to $+1.1V$.

19. The capacitor of claim 18 wherein the $Al_xZr_yO_z$-comprising material is received between the first $Al_2O_3$-comprising material and the $TiO_2$-comprising material.

20. The capacitor of claim 18 wherein the $Al_xZr_yO_z$-comprising material is received between the second $Al_2O_3$-comprising material and the $TiO_2$-comprising material.

21. The capacitor of claim 18 wherein $Al_xZr_yO_z$-comprising material is received between the first $Al_2O_3$-comprising material and the $TiO_2$-comprising material, and $Al_xZr_yO_z$-comprising material is received between the second $Al_2O_3$-comprising material and the $TiO_2$-comprising material.

22. The capacitor of claim 18 wherein the second $Al_2O_3$-comprising material has a thickness of from 4 Angstroms to 7 Angstroms.

23. The capacitor of claim 18 wherein the capacitor dielectric region has a thickness no greater than 100 Angstroms.

24. The capacitor of claim 23 wherein the capacitor dielectric region has a thickness no greater than 75 Angstroms.

25. The capacitor of claim 18 wherein the capacitor dielectric region has a dielectric constant k of at least 40.

26. The capacitor of claim 18 wherein the capacitor dielectric region has leakage current no greater than $5\times10^{-8}$ amps/cm$^2$ at from $-1.1V$ to $+1.1V$.

27. The capacitor of claim 18 wherein the second $Al_2O_3$-comprising material is of different composition from that of the first $Al_2O_3$-comprising material.

28. A capacitor comprising:
an inner conductive metal capacitor electrode and an outer conductive metal capacitor electrode; and
a capacitor dielectric region received between the inner and the outer conductive metal capacitor electrodes and having a thickness no greater than 150 Angstroms, the capacitor dielectric region comprising:
a first $Al_2O_3$-comprising material outward of the inner electrode, the first $Al_2O_3$-comprising material having a thickness of from 2 Angstroms to 10 Angstroms;
a $TiO_2$-comprising material outward of the first $Al_7O_3$-comprising material, the $TiO_2$-comprising material having a thickness of from 40 Angstroms to 80 Angstroms;
a second $Al_2O_3$-comprising material outward of the $TiO_2$-comprising material, the second $Al_2O_3$-comprising material having a thickness of from 2 Angstroms to 10 Angstroms;

a ZrO$_2$-comprising material outward of the second Al$_2$O$_3$-comprising material, the ZrO$_2$-comprising material having a thickness of from 30 Angstroms to 70 Angstroms;

a third Al$_2$O$_3$-comprising material outward of the ZrO$_2$-comprising material, the third Al$_2$O$_3$-comprising material having a thickness of from 2 Angstroms to 10 Angstroms; and the capacitor dielectric region having in combination a dielectric constant k of at least 35 and leakage current no greater than $1\times10^{-7}$ amps/cm$^2$ at from $-1.1$V to $+1.1$V.

29. A capacitor comprising:

an inner conductive metal capacitor electrode and an outer conductive metal capacitor electrode; and a capacitor dielectric region received between the inner and the outer conductive metal capacitor electrodes and having a thickness no greater than 150 Angstroms, the capacitor dielectric region comprising:

an optional first Al$_2$O$_3$-comprising material outward of the inner electrode, the optional first Al$_2$O$_3$-comprising material having a thickness of from 0 Angstroms to 10 Angstroms;

a ZrO$_2$-comprising material outward of the inner electrode and outward of the optional first Al$_2$O$_3$-comprising material if the optional first Al$_2$O$_3$-comprising material is present, the ZrO$_2$-comprising material having a thickness of from 30 Angstroms to 70 Angstroms;

a second Al$_2$O$_3$-comprising material outward of the ZrO$_2$-comprising material, the second Al$_2$O$_3$-comprising material having a thickness of from 2 Angstroms to 16 Angstroms;

a TiO$_2$-comprising material outward of the second Al$_2$O$_3$-comprising material, the TiO$_2$-comprising material having a thickness of from 40 Angstroms to 80 Angstroms;

a third Al$_2$O$_3$-comprising material outward of the TiO$_2$-comprising material, the third Al$_2$O$_3$-comprising material having a thickness of from 2 Angstroms to 10 Angstroms; and a sum of the thicknesses of the optional first Al$_2$O$_3$-comprising material if present, the ZrO$_2$-comprising material, and the second Al$_2$O$_3$-comprising material totals no more than 70 Angstroms; the capacitor dielectric region having in combination a dielectric constant k of at least 35 and leakage current no greater than $1\times10^{-7}$ amps/cm$^2$ at from $-1.1$V to $+1.1$V.

30. The capacitor of claim 29 wherein the capacitor dielectric region comprises the optional first Al$_2$O$_3$-comprising material outward of the inner electrode and inward of the ZrO$_2$-comprising material.

31. The capacitor of claim 29 wherein the capacitor dielectric region is void of the optional first Al$_2$O$_3$-comprising material outward of the inner electrode and inward of the ZrO$_2$-comprising material.

32. A capacitor comprising:

an inner conductive metal capacitor electrode and an outer conductive metal capacitor electrode; and a capacitor dielectric region received between the inner and the outer conductive metal capacitor electrodes and having a thickness no greater than 33 Angstroms, the capacitor dielectric region comprising:

a first Al$_2$O$_3$-comprising material outward of the inner electrode, the first Al$_2$O$_3$-comprising material having a thickness of from 2 Angstroms to 10 Angstroms;

a TiO$_2$-comprising material outward of the first Al$_2$O$_3$-comprising material, the TiO$_2$-comprising material having a thickness of from 40 Angstroms to 80 Angstroms;

a second Al$_2$O$_3$-comprising material outward of the TiO$_2$-comprising material, the second Al$_2$O$_3$-comprising material having a thickness of from 2 Angstroms to 10 Angstroms, the second Al$_2$O$_3$ comprising material being of different composition from that of the first Al$_2$O$_3$-comprising material; and the capacitor dielectric region having in combination a dielectric constant k of at least 35 and leakage current no greater than $1\times10^{-7}$ amps/cm$^2$ at from $-1.1$V to $+1.1$V.

* * * * *

UNITED STATES PATENT AND TRADEMARK OFFICE
CERTIFICATE OF CORRECTION

PATENT NO. : 8,310,807 B2  
APPLICATION NO. : 12/483474  
DATED : November 13, 2012  
INVENTOR(S) : Rishikesh Krishnan et al.

It is certified that error appears in the above-identified patent and that said Letters Patent is hereby corrected as shown below:

In column 18, line 60, in Claim 28, delete "$Al_7O_3$-" and insert -- $Al_2O_3$- --, therefor.

In column 20, line 21, in Claim 32, delete "33" and insert -- 150 --, therefor.

In column 20, line 33, in Claim 32, delete "$Al_7O_3$ comprising" and insert -- $Al_2O_3$-comprising --, therefor.

Signed and Sealed this
Twenty-second Day of January, 2013

David J. Kappos
*Director of the United States Patent and Trademark Office*